(12) United States Patent
Yang et al.

(10) Patent No.: US 12,255,112 B2
(45) Date of Patent: Mar. 18, 2025

(54) TEST KEY AND SEMICONDUCTOR DIE INCLUDING THE SAME

(71) Applicant: Taiwan Semiconductor Manufacturing Company, Ltd., Hsinchu (TW)

(72) Inventors: Tse-Pan Yang, Hsinchu (TW); Wei Lee, Hsinchu (TW); Kuo-Pei Lu, Hsinchu County (TW); Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 530 days.

(21) Appl. No.: 17/693,439

(22) Filed: Mar. 14, 2022

(65) Prior Publication Data

US 2023/0290694 A1    Sep. 14, 2023

(51) Int. Cl.
| | |
|---|---|
| *H01L 21/66* | (2006.01) |
| *G01R 31/28* | (2006.01) |
| *H01L 23/48* | (2006.01) |
| *H01L 23/498* | (2006.01) |
| *H01L 49/02* | (2006.01) |

(52) U.S. Cl.
CPC .......... *H01L 22/30* (2013.01); *G01R 31/2884* (2013.01); *H01L 23/481* (2013.01); *H01L 23/49822* (2013.01); *H01L 28/20* (2013.01)

(58) Field of Classification Search
CPC ............ H01L 22/30; H01L 22/34; H01L 2225/06596; H01L 22/14; H01L 22/32; H01L 23/481; H01L 28/20; H01L 2225/06541; H01L 23/522; G01R 31/2884
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2013/0196458 A1* | 8/2013 | Lin ............ H01L 25/0657 438/18 |
| 2023/0046800 A1* | 2/2023 | Lee ............ H01L 22/32 |

* cited by examiner

*Primary Examiner* — Wasiul Haider
(74) *Attorney, Agent, or Firm* — JCIPRNET

(57) ABSTRACT

A test key configured to measure resistance of a through semiconductor via in a semiconductor substrate is provided. The test key includes a first resistor, a first conductor, a first probe pad, a second conductor, a second probe pad, a third conductor, a third probe pad, a fourth conductor, and a fourth probe pad. The first probe pad is electrically connected to a first end of the through semiconductor via by the first resistor and the first conductor. The second probe pad is electrically connected to the first end of the through semiconductor via by the second conductor. The third probe pad is electrically connected to a second end of the through semiconductor via by the third conductor. The fourth probe pad is electrically connected to the second end of the through semiconductor via by the fourth conductor.

20 Claims, 24 Drawing Sheets

US 12,255,112 B2

TEST KEY AND SEMICONDUCTOR DIE INCLUDING THE SAME

BACKGROUND

Though semiconductor vias (TSVs) are widely used in CMS image sensor (CIS), three dimensional integrated circuits (3DICs) and 3D packages. Dictated by the manufacturing process, there exit three different types of TSVs: via-first TSVs are fabricated before the individual devices (transistors, capacitors, resistors, etc.) are patterned (front end of line, FEOL), via-middle TSVs are fabricated after the individual devices are patterned but before the metal layers (back-end-of-line, BEOL), and via-last TSVs are fabricated after (or during) the BEOL process. Currently, it is difficult to monitor the resistance of TSVs because the resistance of the TSVs is low.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
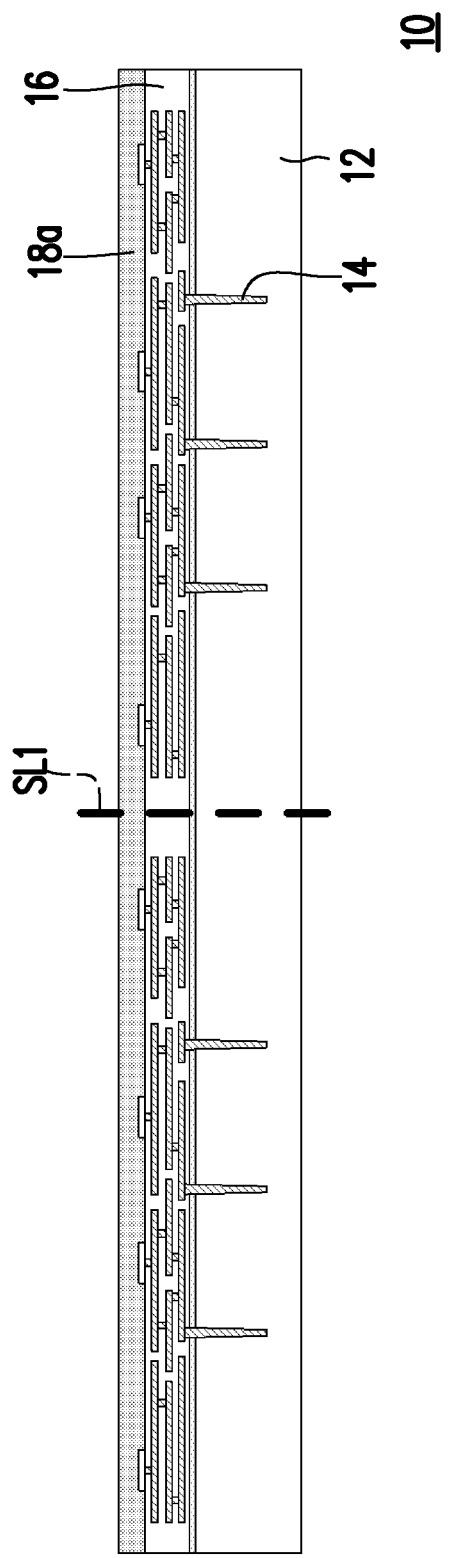
FIGS. 1A through 1L are cross-sectional views schematically illustrating a process flow for fabricating SoIC structures in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A through 1L are cross-sectional views schematically illustrating a process flow for fabricating SoIC structures in accordance with some embodiments of the present disclosure.

Referring to FIG. 1A, a wafer 10 including semiconductor dies is provided. The semiconductor dies may be logic dies, System-on-Chip (SoC) dies or other suitable semiconductor dies. The wafer 10 may include a semiconductor substrate 12 (e.g., a semiconductor substrate), through substrate vias 14 embedded in the semiconductor substrate 12, an interconnect structure 16 disposed on the semiconductor substrate 12, and a bonding dielectric layer 18a disposed on the interconnect structure 16, wherein the through substrate vias 14 are electrically connected to the interconnect structure 116. The semiconductor substrate 12 of the semiconductor wafer 10 may include a crystalline silicon wafer. The semiconductor substrate 12 may include various doped regions depending on design requirements (e.g., p-type substrate or n-type substrate). In some embodiments, the doped regions may be doped with p-type or n-type dopants. The doped regions may be doped with p-type dopants, such as boron or BF2; n-type dopants, such as phosphorus or arsenic; and/or combinations thereof. The doped regions may be configured for n-type Fin-type Field Effect Transistors (FinFETs) and/or p-type FinFETs. In some alternative embodiments, the semiconductor substrate 12 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The through substrate vias 14 may be formed by forming recesses in the semiconductor substrate 12 by, for example, etching, milling, laser techniques, a combination thereof, or the like. The through substrate vias 14 may be via-first TSVs, via-middle TSVs, and via-last TSVs. A thin barrier layer may be conformally deposited over the front side of the semiconductor substrate 12 and in the openings, such as by chemical vapor deposition (CVD), atomic layer deposition (ALD), physical vapor deposition (PVD), thermal oxidation, a combination thereof, or the like. The barrier layer may comprise a nitride or an oxynitride, such as titanium nitride, titanium oxynitride, tantalum nitride, tantalum oxynitride, tungsten nitride, a combination thereof, or the like. A conductive material is deposited over the thin barrier layer and in the openings. The conductive material may be formed by an electro-chemical plating process, CVD, ALD, PVD, a combination thereof, or the like. Examples of conductive materials are copper, tungsten, aluminum, silver, gold, a combination thereof, or the like. Excess conductive material and barrier layer may be removed from the front side of the semiconductor substrate 12 by, for example, chemical mechanical polishing. Thus, in some embodiments, the through substrate vias 14 may comprise a conductive material and a thin barrier layer between the conductive material and the semiconductor substrate 12.

The interconnect structure 16 may include one or more dielectric layers (for example, one or more interlayer dielectric (ILD) layers, intermetal dielectric (IMD) layers, or the like) and interconnect conductors embedded in the one or more dielectric layers, and the interconnect conductors are electrically connected to the semiconductor devices (e.g., FinFETs) formed in the semiconductor substrate 12 and/or the through substrate vias 14. The material of the one or more dielectric layers may include silicon oxide ($SiO_x$, where x>0), silicon nitride ($SiN_x$, where x>0), silicon oxynitride ($SiO_xN_y$, where x>0 and y>0) or other suitable dielectric material. The interconnect conductors may include metallic conductors. For example, the interconnect conductors include copper conductors, copper pads, aluminum pads or combinations thereof. In some embodiments, the through substrate vias 14 may extend through one or more layers of the interconnect structure 16 and into the semiconductor substrate 12.

The material of the bonding dielectric layer 18a may be silicon oxide ($SiO_x$, where x>0), silicon nitride ($SiN_x$, where x>0), silicon oxynitride ($SiO_xN_y$, where x>0 and y>0) or other suitable dielectric material. The bonding dielectric layer 18a may be formed by depositing a dielectric material through a chemical vapor deposition (CVD) process (e.g., a plasma enhanced CVD process or other suitable process).

Figure 1B:
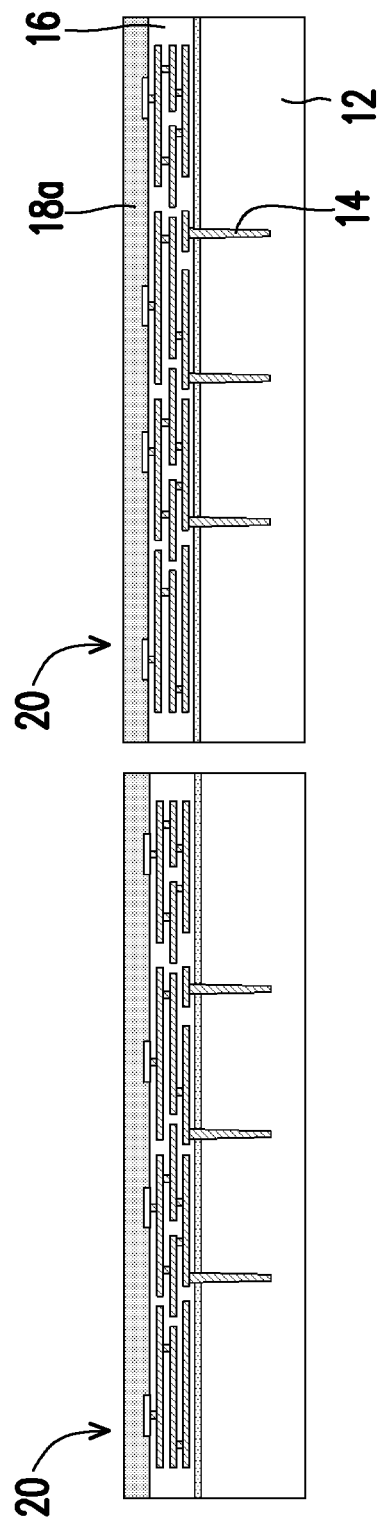

Referring to FIG. 1A and FIG. 1B, the semiconductor wafer 10 is singulated by a wafer sawing process performed along scribe lines SL1 such that singulated semiconductor dies 20 are obtained. Each of the singulated semiconductor dies 20 may include a semiconductor substrate 12, through substrate vias 14 embedded in the semiconductor substrate 12, an interconnect structure 16 disposed on the semiconductor substrate 12, and a bonding dielectric layer 18a disposed on the interconnect structure 16. As illustrated in FIG. 1B, the through substrate vias 14 are buried in the semiconductor substrate 12 and the interconnect structure 16. The through semiconductor vias 14 are not revealed from a back surface of the semiconductor substrate 12 at this stage.

Figure 1C:
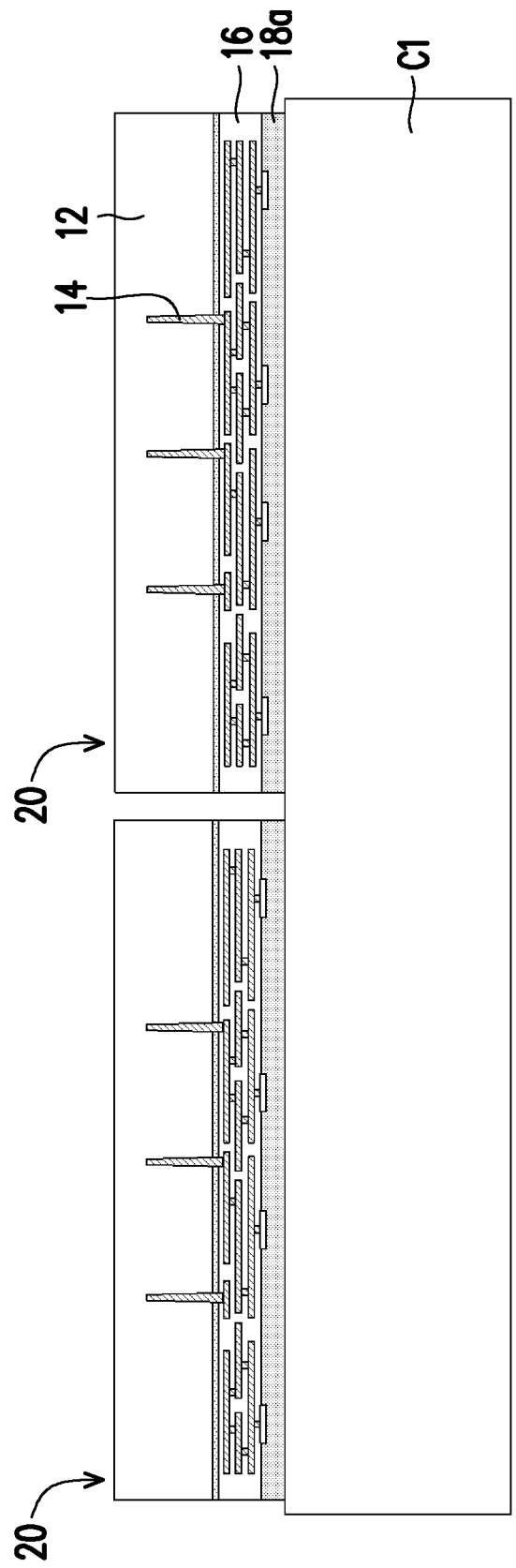

Referring to FIG. 1C, the singulated semiconductor dies 20 are picked-up and placed on a carrier C1 in a side-by-side manner such that front surfaces of the singulated semiconductor dies 20 are bonded to the carrier C1. The carrier C1 may be a semiconductor wafer such as a silicon wafer. The carrier C1 may have a round top-view shape and a size of a silicon wafer. For example, carrier C1 may have an 8-inch diameter, a 12-inch diameter, or the like. The singulated semiconductor dies 20 are bonded to the carrier C1 through a chip-to-wafer bonding process. A bonding process is performed to bond the bonding dielectric layers 18a of the singulated semiconductor dies 20 with the carrier C1. The bonding process may be a direct bonding process. After performing the above-mentioned direct bonding process, a semiconductor-to-dielectric bonding interface such as silicon-to-nitride (Si—$SiN_x$) bonding interface may be formed between the bonding dielectric layer 18a and the carrier C1.

Figure 1D:
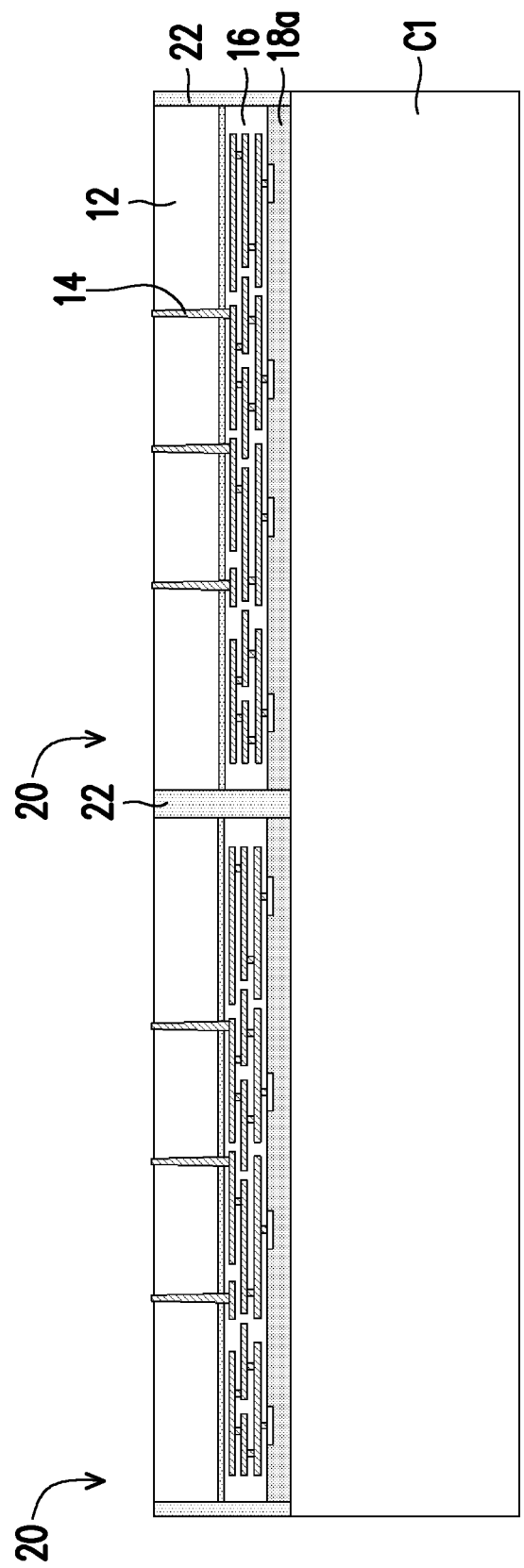

Referring to FIG. 1D, an insulating encapsulation material is formed over the carrier C1 to cover the singulated semiconductor dies 20 which are bonded with the carrier C1. The insulating encapsulation material may be a molding compound (e.g., epoxy or other suitable resin) formed through an over-molding process. The insulating encapsulation material fills the gaps between neighboring semiconductor dies 20 and covers back surfaces of the singulated semiconductor dies 20. After forming the insulating encapsulation material over the carrier C1, the insulating encapsulation material and the semiconductor substrates 12 of the semiconductor dies 20 are partially remove such that the semiconductor substrates 12 of the semiconductor dies 20 are thinned and an insulating encapsulant 22 are formed to laterally encapsulate the semiconductor dies 20. The insulating encapsulation material and the semiconductor substrate 12 of the semiconductor dies 20 may be partially remove through a planarization process such as a Chemical Mechanical Polish (CMP) process and/or a mechanical grinding process. After performing the above-mentioned planarization process, the thickness of the insulating encapsulant 22 is substantially equal to that of the semiconductor dies 20. In other words, the top surface of the insulating encapsulant 22 is substantially level with back surfaces of the semiconductor dies 20. As illustrated in FIG. 1D, after performing the above-mentioned planarization process, the through semiconductor vias 14 are revealed from the back surfaces of the semiconductor substrates 12 at this stage. The through semiconductor vias 14 may protrude from the back surfaces of the semiconductor substrates 12.

Figure 1E:
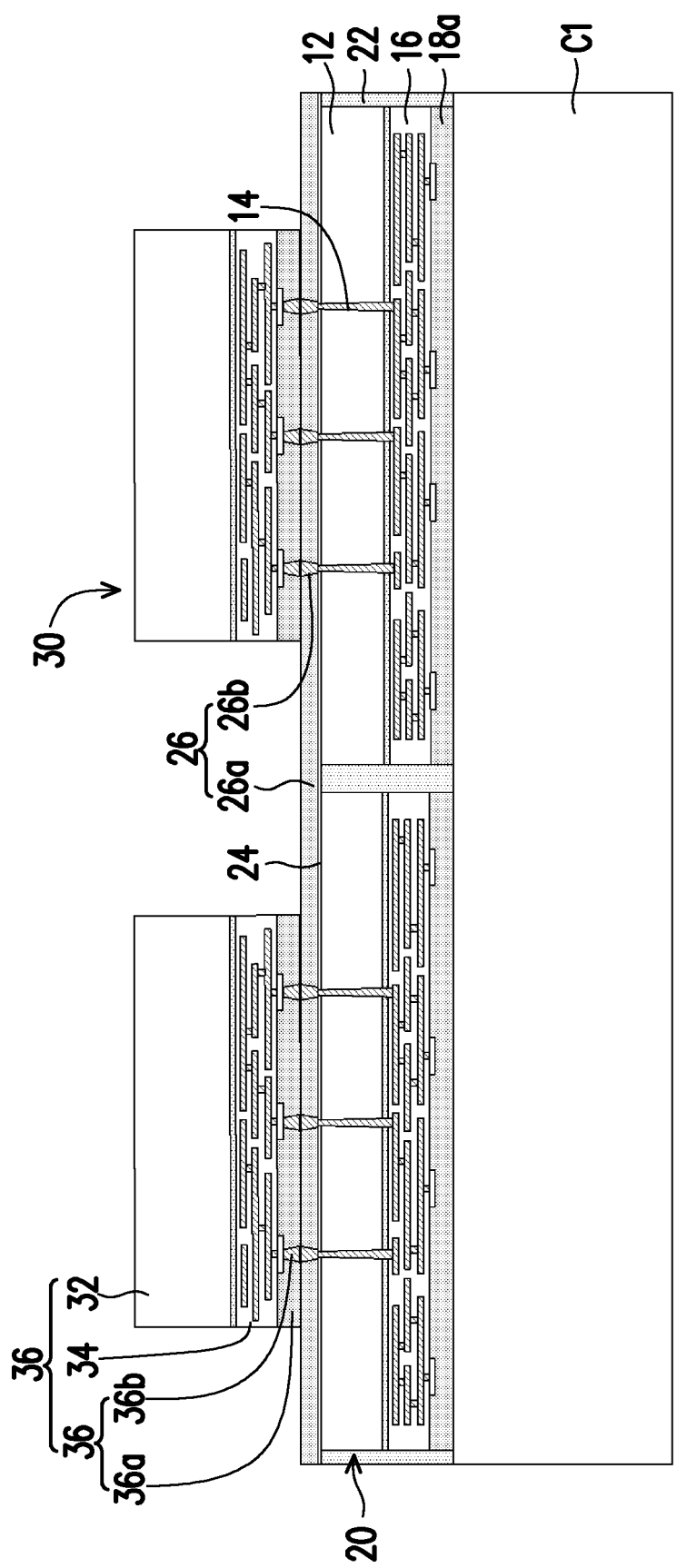

Referring to FIG. 1E, a dielectric material may be formed over the back surfaces of the semiconductor substrates 12 and the top surface of the insulating encapsulant 22 to cover the revealed through semiconductor vias 14. The dielectric material may be or include silicon oxide ($SiO_x$, where x>0), silicon nitride ($SiN_x$, where x>0), silicon oxynitride ($SiO_xN_y$, where x>0 and y>0) or other suitable dielectric material. A planarization process such as a Chemical Mechanical Polish (CMP) process and/or a mechanical grinding process may be performed to partially remove the dielectric material such that a planarization layer 24 is formed on the back surfaces of the semiconductor substrates 12 and the top surface of the insulating encapsulant 22. The top surface of the planarization layer 24 is substantially level with top ends of the through semiconductor vias 14.

After forming the planarization layer 24, a bonding structure 26 including a bonding dielectric layer 26a and bonding conductors 26b embedded in the bonding dielectric layer 26a. The material of the bonding dielectric layer 26a may be silicon oxide ($SiO_x$, where x>0), silicon nitride ($SiN_x$, where x>0), silicon oxynitride ($SiO_xN_y$, where x>0 and y>0) or other suitable dielectric material, and the bonding conductors 26b may be conductive vias (e.g., copper vias), conductive pads (e.g., copper pads) or combinations thereof. The bonding structure 26 may be formed by depositing a dielectric material through a chemical vapor deposition (CVD) process (e.g., a plasma enhanced CVD process or other suitable process); patterning the dielectric material to form the bonding dielectric layer 26a including openings or through holes; and filling conductive material in the openings or through holes defined in the bonding dielectric layer 26a to form the bonding conductors 26b embedded in the bonding dielectric layer 26a. In some embodiments, the conductive material for forming the bonding conductors 26b may be formed through a chemical vapor deposition (CVD) process (e.g., a plasma enhanced CVD process or other suitable process) followed by a planarization process (e.g., a Chemical Mechanical Polish (CMP) process and/or a mechanical grinding process).

After forming the bonding structure 26, semiconductor dies 30 are provided. The semiconductor dies 30 may be logic dies, System-on-Chip (SoC) dies or other suitable semiconductor dies. The semiconductor dies 30 and the semiconductor dies 20 may perform the same function or different functions. In some embodiments, the semiconductor dies 30 and the semiconductor dies 30 are System on Chip (SoC) dies. Each of the semiconductor dies 30 may include a semiconductor substrate 32 and an interconnect structure 34 disposed on the semiconductor substrate 32 respectively. Furthermore, bonding structures 36 may be formed on the interconnect structures 34 of the semiconductor dies 30. The bonding structure 36 includes a bonding dielectric layer 36a and bonding conductors 36b embedded in the bonding dielectric layer 36a. The material of the bonding dielectric layer 36a may be silicon oxide ($SiO_x$, where x>0), silicon nitride ($SiN_x$, where x>0), silicon oxynitride ($SiO_xN_y$, where x>0 and y>0) or other suitable dielectric material, and the bonding conductors 36b may be conductive vias (e.g., copper vias), conductive pads (e.g., copper pads) or combinations thereof. The bonding structure 36 may be formed by depositing a dielectric material through a chemical vapor deposition (CVD) process (e.g., a plasma enhanced CVD process or other suitable process); patterning the dielectric material to form the bonding dielectric layer 36a including openings or through holes; and filling conductive material in the openings or through holes defined in the bonding dielectric layer 36a to form the bonding conductors 36b embedded in the bonding dielectric layer 36a. In some embodiments, the conductive material for forming the bonding conductors 36b may be formed through a chemical vapor deposition (CVD) process (e.g., a plasma enhanced CVD process or other suitable process) followed by a planarization process (e.g., a Chemical Mechanical Polish (CMP) process and/or a mechanical grinding process).

A bonding process (e.g., a chip-to-wafer bonding process) is performed to bond the bonding structures 36 formed on the semiconductor dies 30 with bonding regions of the bonding structure 26. The bonding process may be a hybrid bonding process that includes dielectric-to-dielectric bonding and metal-to-metal bonding. After performing the above-mentioned bonding process, a dielectric-to-dielectric bonding interface is formed between the bonding dielectric layer 26a and the bonding dielectric layer 36a, and metal-to-metal bonding interfaces are formed between the bonding conductors 26b and bonding conductors 36b. After performing the bonding process, the semiconductor dies 30 are electrically connected to the semiconductor dies 20 through the bonding structures 36 and the bonding structure 26.

As illustrated in FIG. 1E, the semiconductor dies 30 may be disposed above the semiconductor dies 20. The lateral dimension (e.g., width and/or length) of the semiconductor dies 20 may be greater than the lateral dimension (e.g., width and/or length) of the semiconductor dies 30. Since the bonding structures 36 are merely bonded with bonding regions of the bonding structure 26, portions of the bonding dielectric layer 26a are not covered by the bonding structures 36. In some embodiments, at least one dummy die (not shown in FIG. 1E) may be provided aside the semiconductor dies 30 and stacked over the semiconductor dies 20.

Figure 1F:
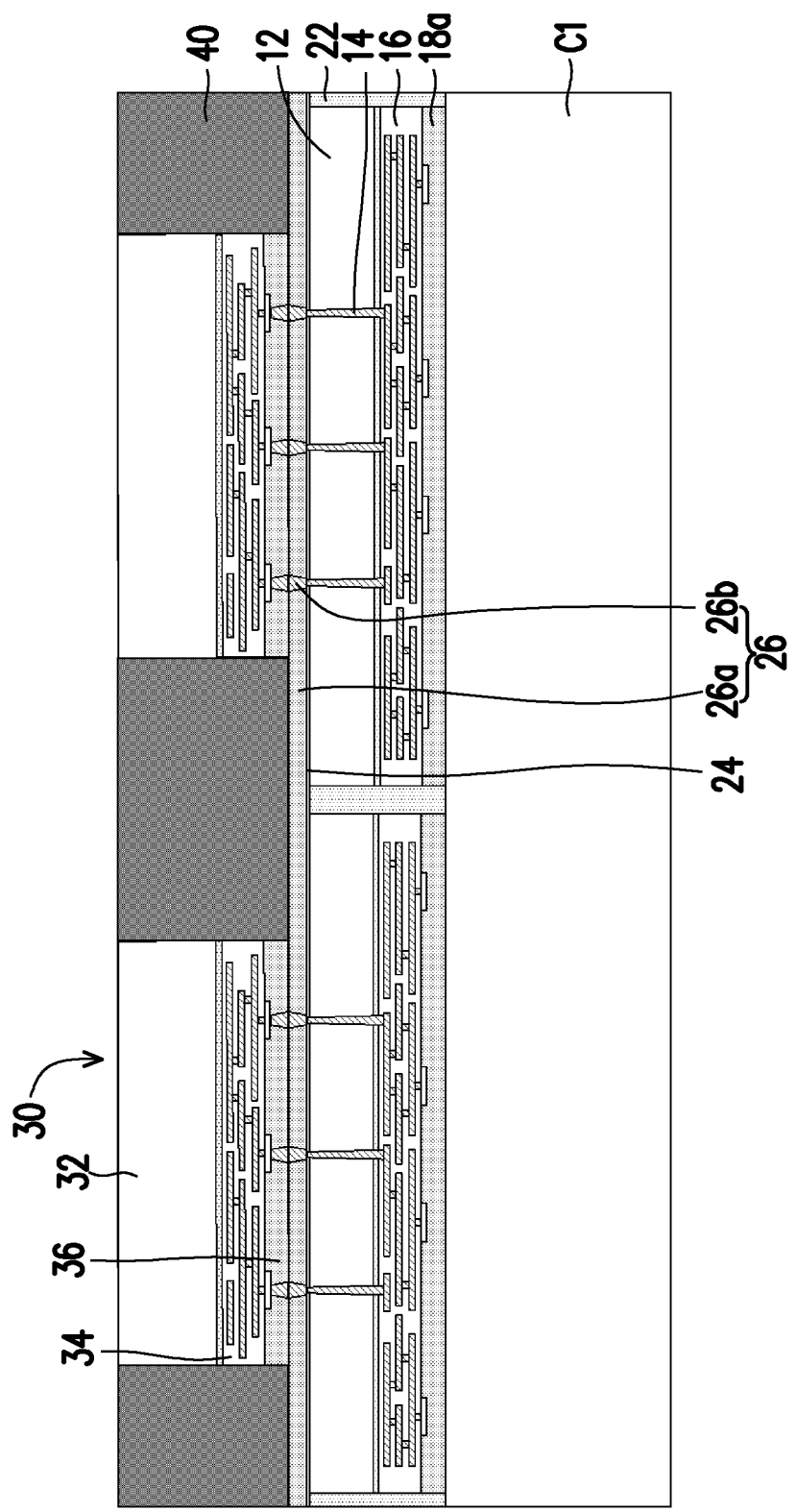

Referring FIG. 1F, an insulating encapsulation material is formed over the semiconductor dies 20 and the insulating encapsulant 22 to cover the semiconductor dies 30. The insulating encapsulation material may be a molding compound (e.g., epoxy or other suitable resin) formed through an over-molding process. The insulating encapsulation material fills the gaps between neighboring semiconductor dies 30 and laterally encapsulates the semiconductor dies 30. After forming the insulating encapsulation material over the semiconductor dies 20 and the insulating encapsulant 22, the insulating encapsulation material is partially removed until the semiconductor substrates 32 of the semiconductor dies 30 are revealed such that an insulating encapsulant 40 are formed. The insulating encapsulation material may be partially removed through a planarization process such as a Chemical Mechanical Polish (CMP) process and/or a mechanical grinding process. After performing the above-mentioned planarization process, the top surface of the insulating encapsulant 40 substantially levels with back surfaces of the semiconductor dies 30.

Figure 1G:
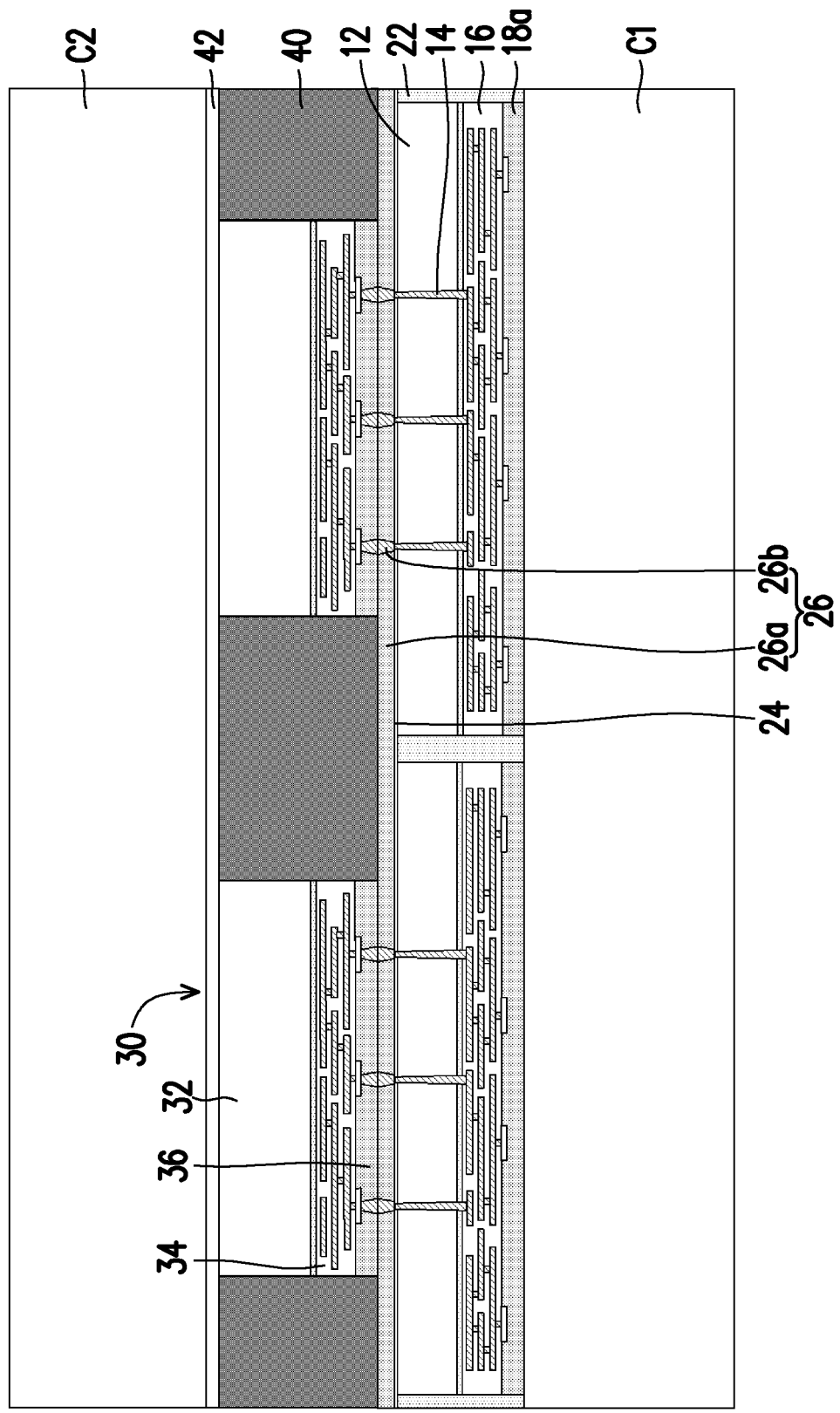

Referring to FIG. 1G, a carrier C2 including a de-bonding layer 42 formed thereon is provided. In some embodiments, the carrier C2 is a glass substrate, a ceramic carrier, or the like. The carrier C2 may have a round top-view shape and a size of a glass substrate. For example, carrier C2 may have an 8-inch diameter, a 12-inch diameter, or the like. The de-bonding layer 42 may be formed of a polymer-based material (e.g., a Light To Heat Conversion (LTHC) material), which may be subsequently removed along with the carrier C2. In some embodiments, the de-bonding layer 42 is formed of an epoxy-based thermal-release material. In other embodiments, the de-bonding layer 42 is formed of an ultra-violet (UV) glue. The de-bonding layer 42 may be dispensed as a liquid and cured. In alternative embodiments, the de-bonding layer 42 is a laminate film and is laminated onto the carrier C2. The top surface of the de-bonding layer 42 is substantially planar.

A bonding process (e.g., a wafer-to-wafer bonding process) is performed to bond the resulted structure formed on the carrier C1 with the de-bonding layer 42 carried by the carrier C2. After the resulted structure formed on the carrier C1 is bonded with the de-bonding layer 42 carried by the carrier C2, the top surface of the insulating encapsulant 40 and the back surfaces of the semiconductor dies 30 are in contact with the de-bonding layer 42.

Figure 1H:
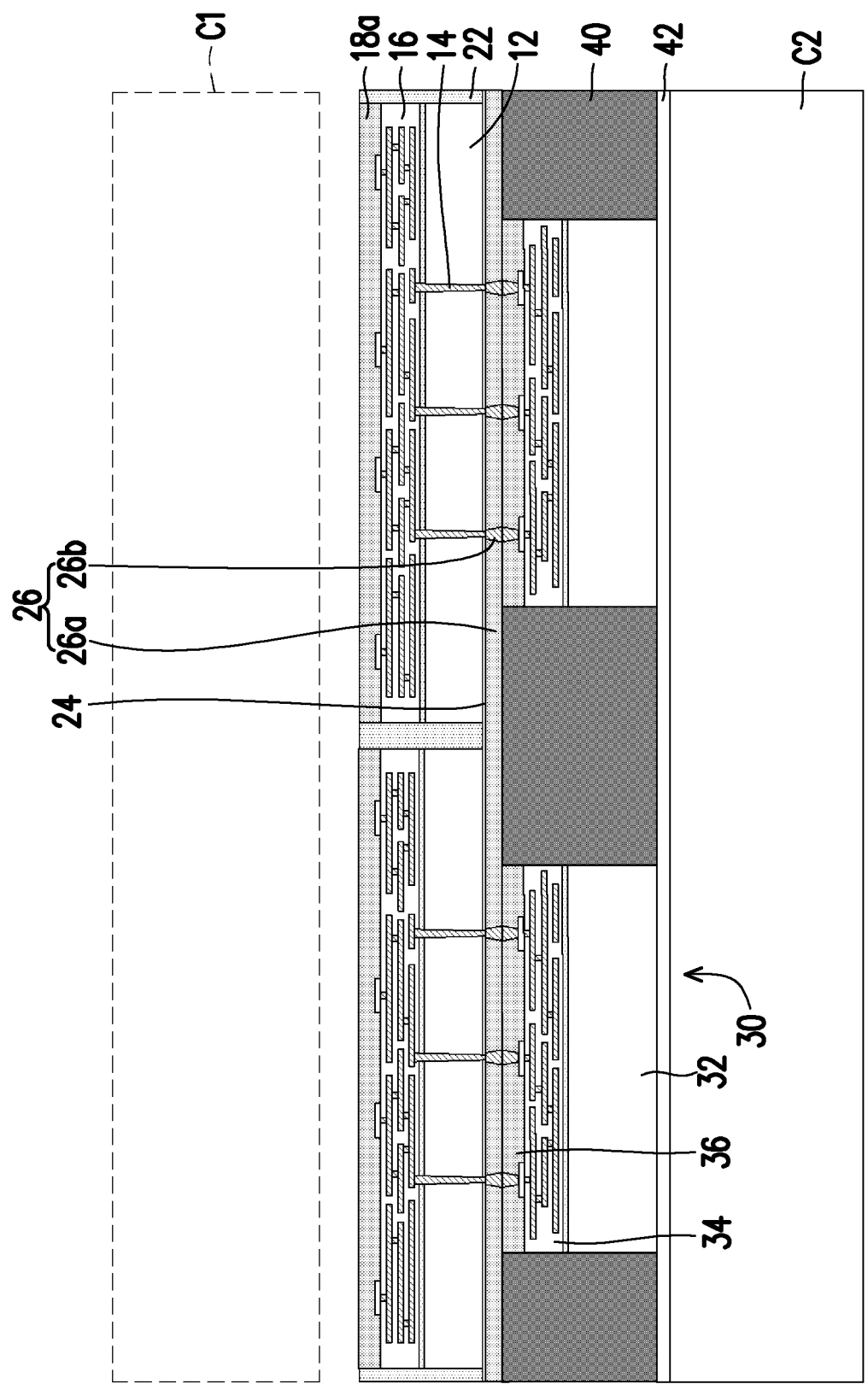

Referring to FIG. 1G and FIG. 1H, after the resulted structure formed on the carrier C1 is bonded with the de-bonding layer 42 carried by the carrier C2, the carrier C1 is de-bonded from the bonding dielectric layers 18a and the insulating encapsulant 22 such that the bonding dielectric layers 18a and the insulating encapsulant 22 are revealed.

Figure 1I:
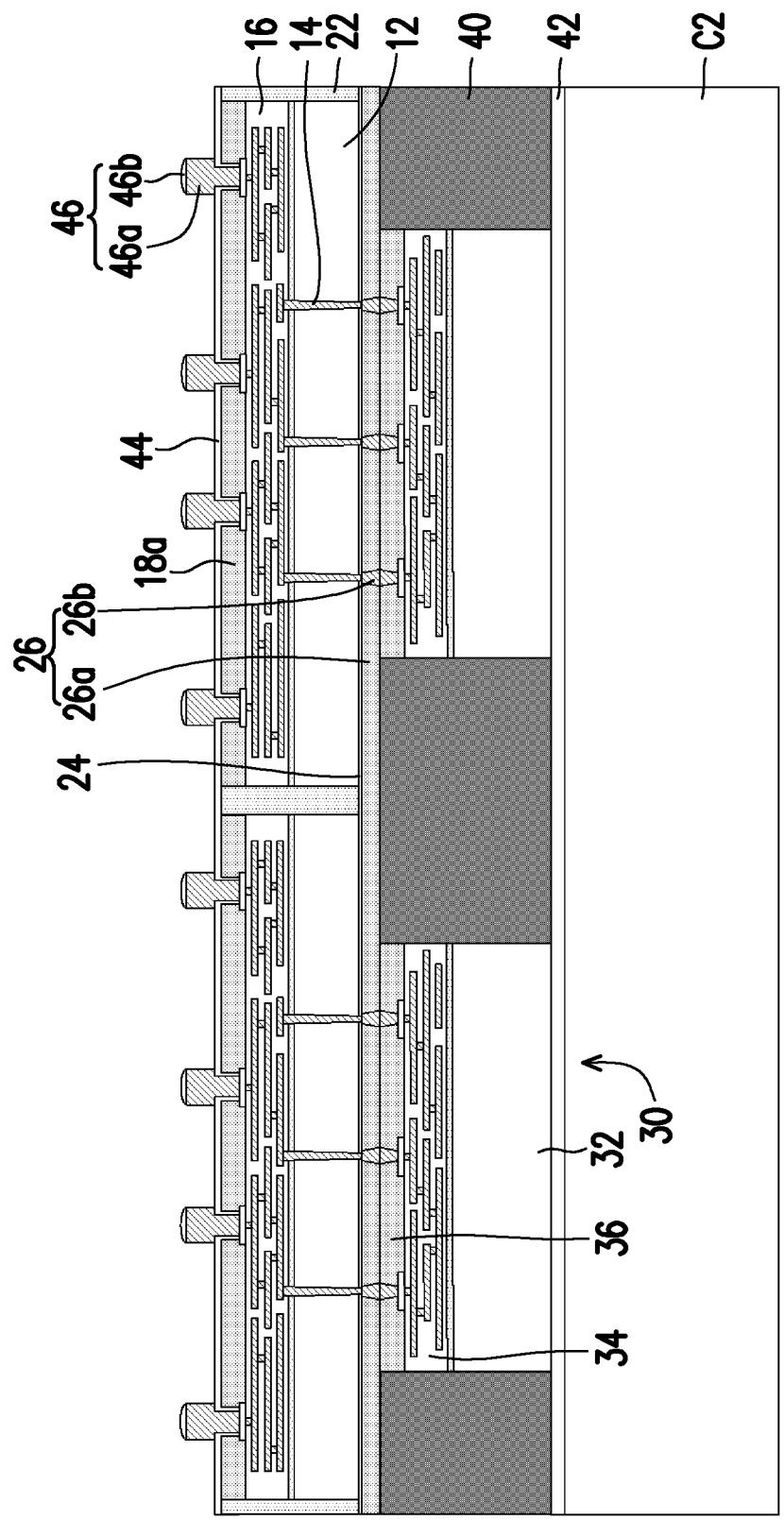

Referring to FIG. 1H and FIG. 1I, the bonding dielectric layers 18a is patterned to form openings such that the topmost interconnect conductors of the interconnect structures 16 are revealed by the openings formed in the bonding dielectric layers 18a. The formation of the openings in the bonding dielectric layers 18a may be performed through a photolithography process. A passivation layer 44 including openings formed therein may be formed to cover the bonding dielectric layers 18a such that the topmost interconnect conductors of the interconnect structures 16 revealed by the openings of the passivation layer 44. The formation of the openings in the passivation layer 44 may be performed through a photolithography process. The width of the openings defined in the passivation layer 44 may be smaller than the width of the openings defined in the bonding dielectric layers 18a. The passivation layer 44 may cover the top surfaces of the bonding dielectric layers 18a and the insulating encapsulant 22. The passivation layer 44 may further extend into the openings defined in the bonding dielectric layers 18a such that the passivation layer 44 is in contact with the topmost interconnect conductors of the interconnect structures 16.

After forming the passivation layer 44, conductive terminals 46 are formed over the passivation layer 44. The conductive terminals 46 are electrically connected to the interconnect conductors of the interconnect structures 16 and protrude from the passivation layer 44. Each of the conductive terminals 46 may respectively include a conductive pillar 46a and a solder cap 46b disposed on the conductive pillar 46a. The conductive pillars 46a fill the openings defined in the passivation layer 44 and protrude from the passivation layer 44. The solder caps 46b covers the top surfaces of the conductive pillars 46a. After forming the conductive terminals 46, a chip probing process may be performed to measure the resistance of at least one through semiconductor via among the through semiconductor vias 14 such that fabrication yields can be increased. The chip probing process is described in accompany with FIGS. 2A through 2C in detail. The formation of the conductive terminals 46 may include forming a seed layer (not shown) over the passivation layer 44, forming a patterned mask (not shown) such as a photoresist layer over the seed layer, and then performing a plating process on the exposed seed layer. The patterned mask and the portions of the seed layer covered by the patterned mask are then removed, leaving the conductive terminals 46. A reflow process may be further performed to re-shape the profile of the solder caps 46a. In accordance with some embodiments, the seed layer includes a titanium layer and a copper layer over the titanium layer. The seed layer may be formed using, for example, Physical Vapor Deposition (PVD). The plating may be performed using, for example, electroless plating.

Figure 1J:
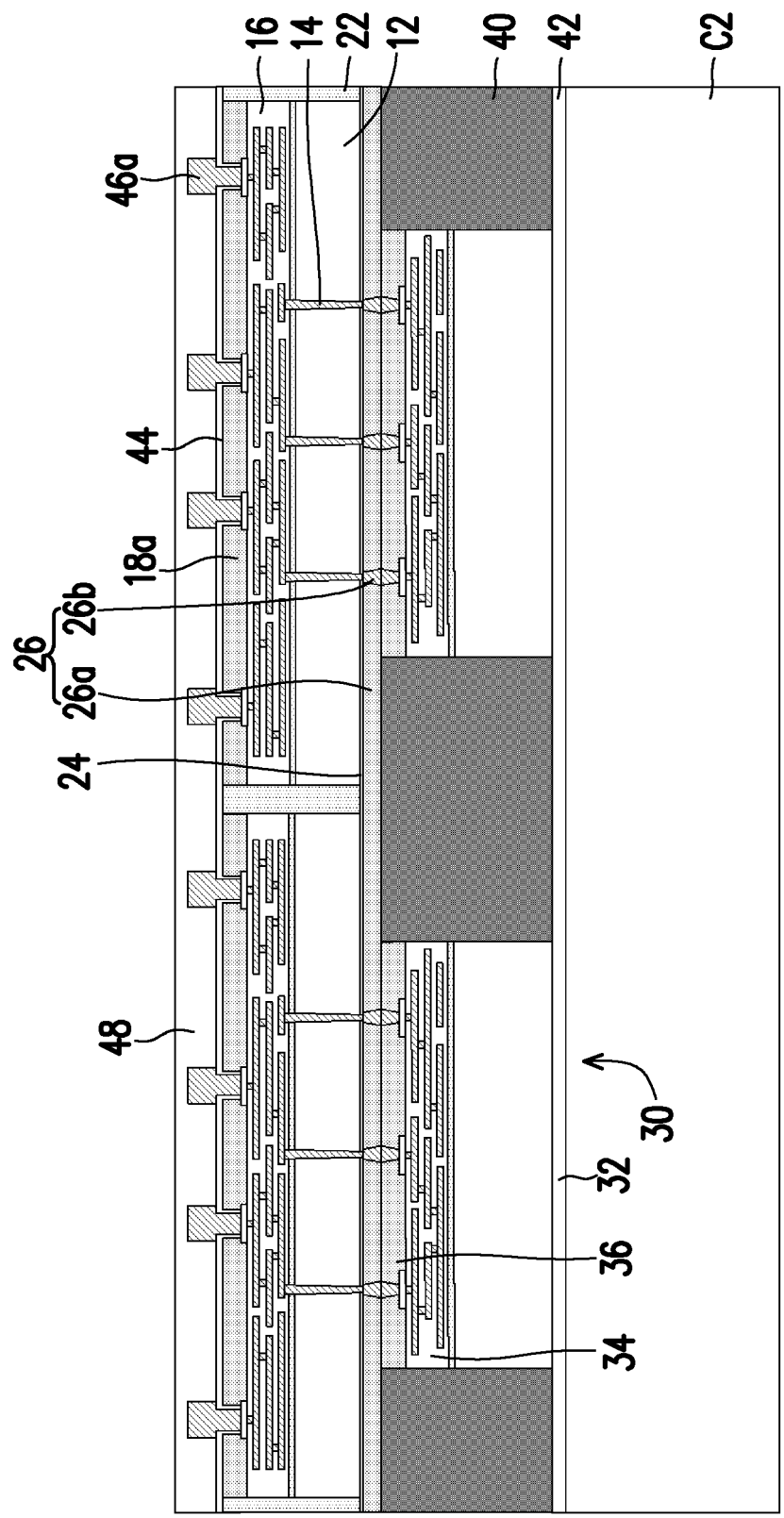

Referring to FIG. 1I and FIG. 1J, after performing the chip probing process, the solder caps 46b are removed and a dielectric layer 48 is formed over the passivation layer 44 to cover the conductive pillars 46a. In some embodiments, the dielectric layer 48 is formed of a polymer, which may be a photo-sensitive material such as polybenzoxazole (PBO), polyimide, benzocyclobutene (BCB), or the like. In some other embodiments, the dielectric layer 48 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 1K:
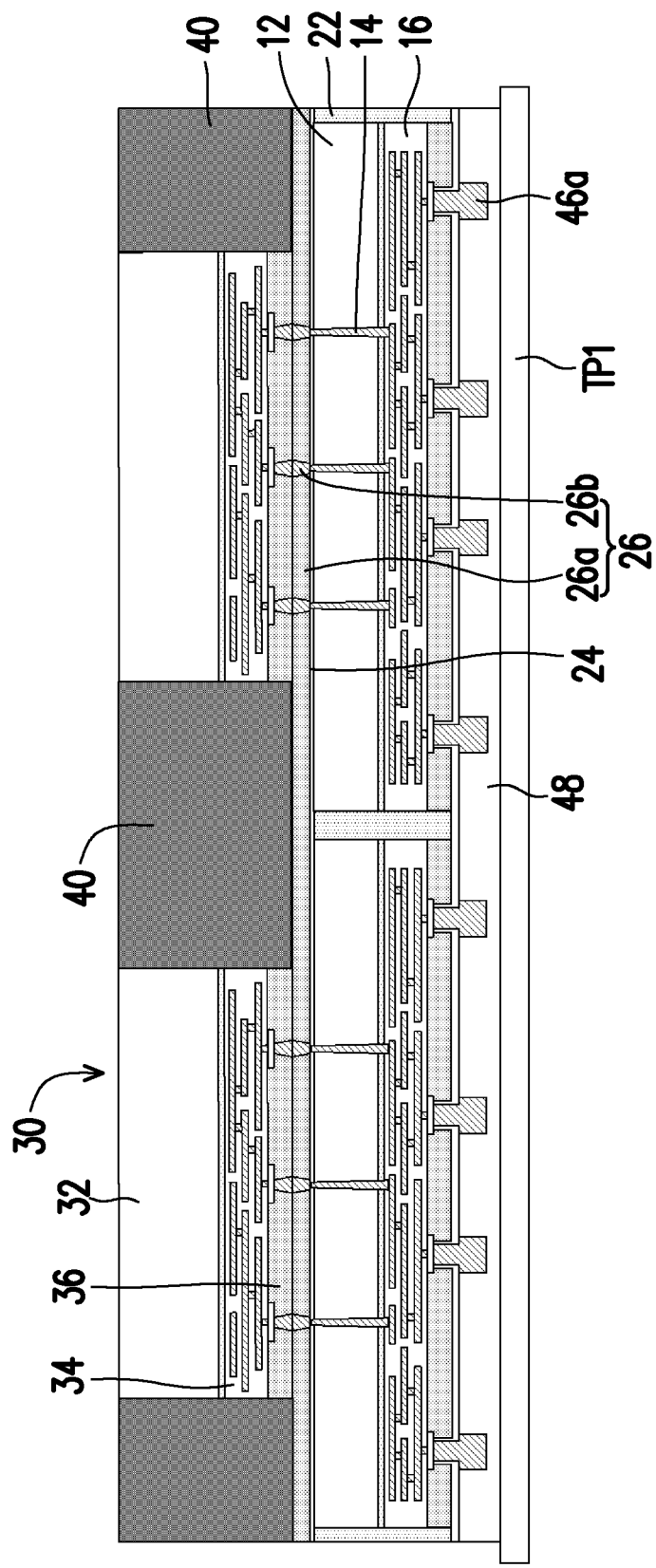

Referring to FIG. 1J and FIG. 1K, a frame mount process is performed such that the resulted structure carried by the carrier C2 is mounted on a tape TP1 carried by a frame. After performing the frame mount process, the dielectric layer 48 is attached on the tape TP1, and a de-bonding process is then performed such that the carrier C2 is de-bonded from the semiconductor dies 30 and the insulating encapsulant 40. After performing the de-bonding process, the back surfaces of the semiconductor dies 30 and the insulating encapsulant 40 are revealed. During the de-bonding process, the de-bonding layer 42 is also cleaned from the semiconductor dies 30 and the insulating encapsulant 40. The de-bonding may be performed by irradiating a light such as UV light or laser on the de-bonding layer 42 to decompose the de-bonding layer 42.

Figure 1L:
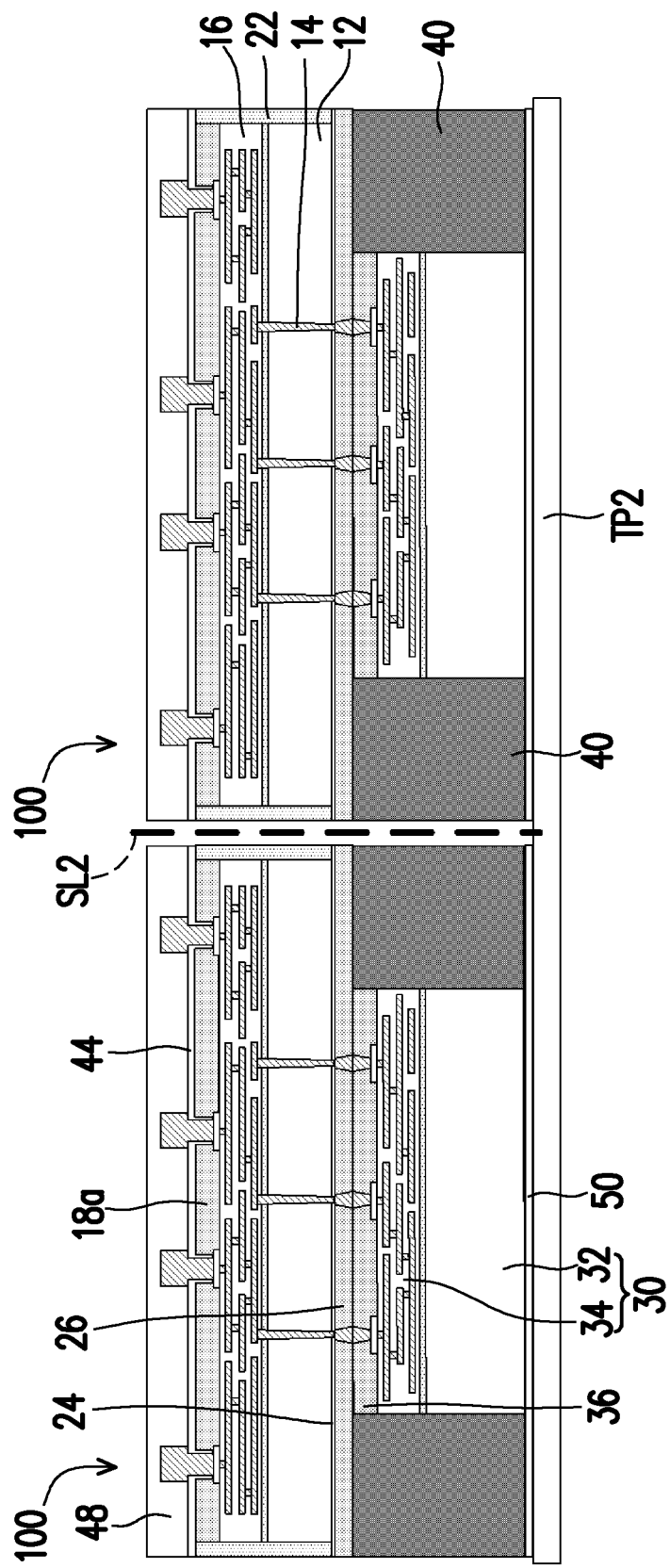

Referring to FIG. 1K and FIG. 1L, a tape TP2 carried by another frame is provided, wherein an attachment film 50 is formed on the tape TP. The resulted structure carried by the tape TP1 is transfer bonded onto the attachment film 50. Then, a singulation process is performed along scribe lines SL2 such that singulated SoIC structures 100 (i.e., device dies) are obtained. During the singulation process, the dielectric layer 48, the passivation layer 44, the insulating encapsulant 22, the planarization layer 24, the bonding structure 26, the insulating encapsulant 40 and the attachment film 50 are cut along scribe lines SL2. In some embodiments, the insulating encapsulant 22 laterally encapsulates the semiconductor die 20, wherein sidewalls of the insulating encapsulant 40 are substantially aligned with sidewalls of the insulating encapsulant 22.

Figure 2A:
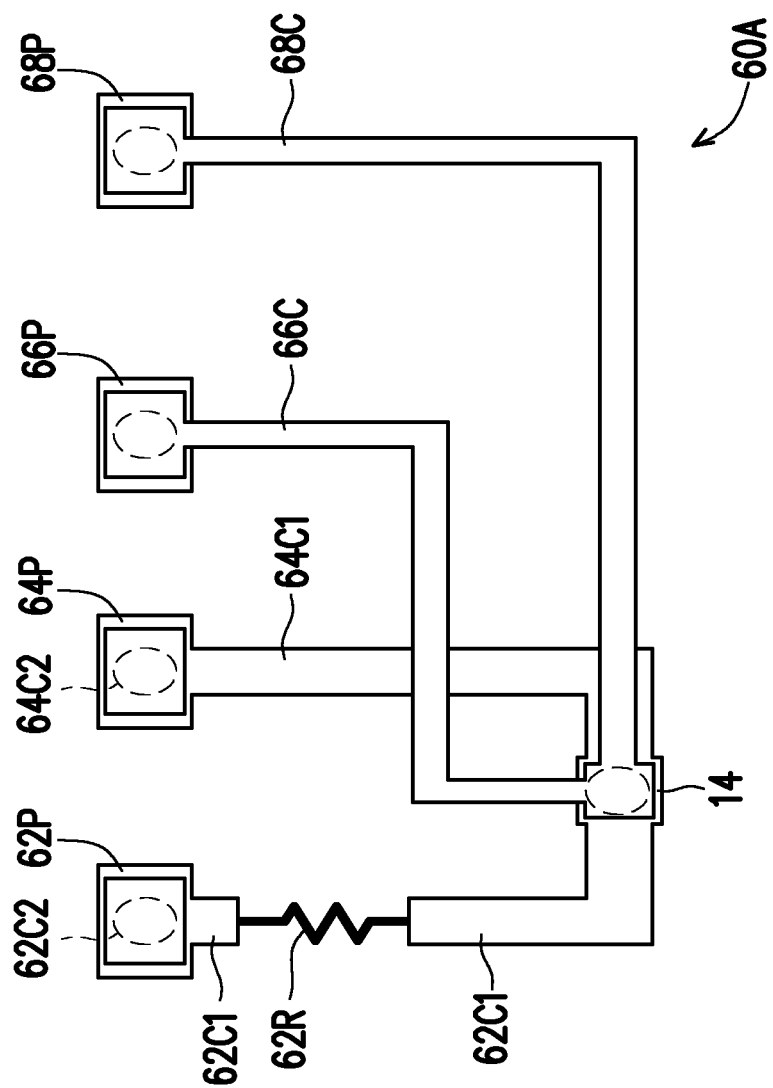
FIGS. 2A through 2C are diagrams schematically illustrating various test keys in accordance with some embodiments of the present disclosure.
Figure 2B:
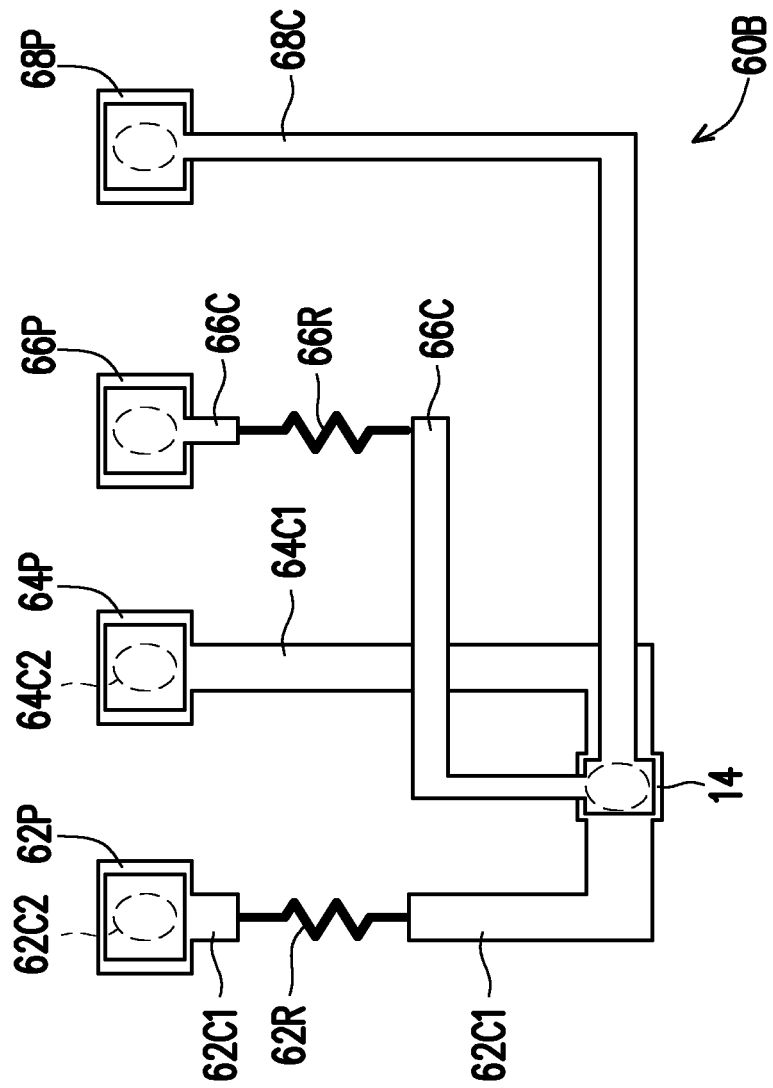
Figure 2C:
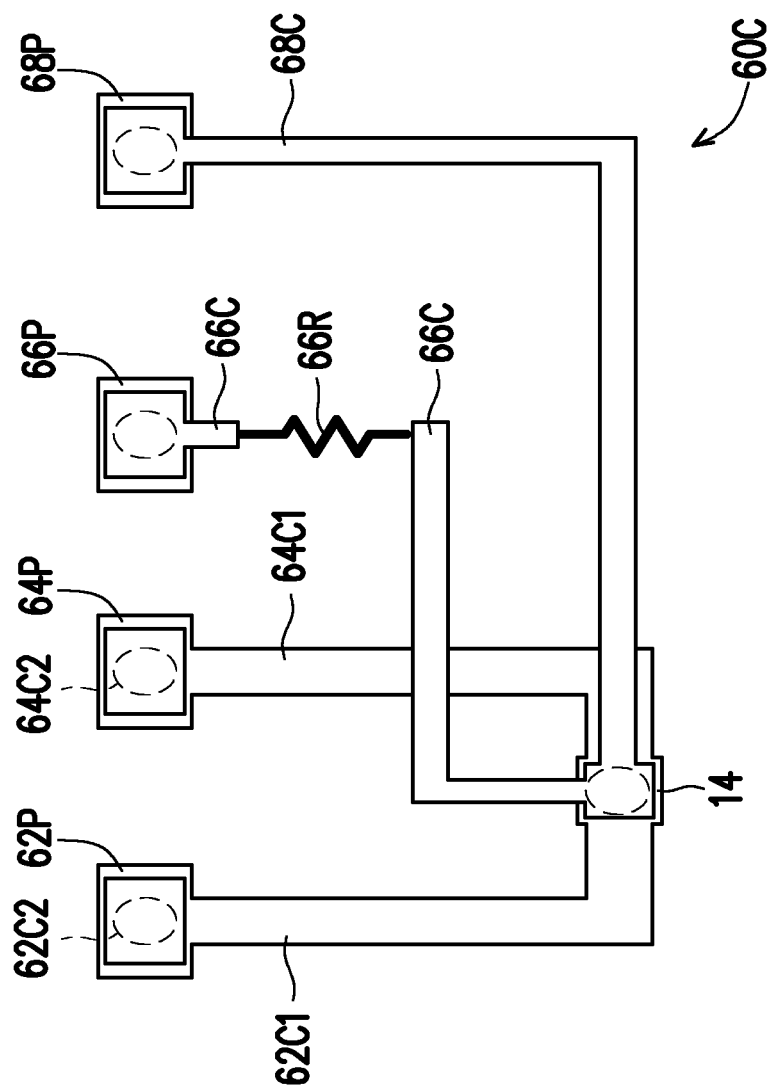

FIGS. 2A through 2C are diagrams schematically illustrating various test keys in accordance with some embodiments of the present disclosure.

Referring to FIG. 2A, a test key 60A configured to measure the resistance of the through semiconductor via 14 embedded in the semiconductor substrate 12 (shown in FIG. 1I) is illustrated. The test key 60A includes a first resistor 62R, a first conductor 62C1 (e.g., a conductor wiring), a first probe pad 62P, a second conductor 64C1 (e.g., a conductor wiring), a second probe pad 64P, a third conductor 66C, a third probe pad 66P, a fourth conductor 68C, and a fourth probe pad 68P. The first probe pad 62P is electrically connected to a first end (e.g., a bottom end) of the through semiconductor via 14 by the first resistor 62R and the first conductor 62C1. The second probe pad 64P is electrically connected to the first end (e.g., a bottom end) of the through semiconductor via 14 by the second conductor 64C1. The third probe pad 66P is electrically connected to a second end (e.g., a top end) of the through semiconductor via 14 by the third conductor 66C. The fourth probe pad 68P is electrically connected to the second end (e.g., a top end) of the through semiconductor via 14 by the fourth conductor 68C. In some embodiments, the first resistor 62R is disposed at a first side (e.g., a back side) of the semiconductor substrate 12 (shown in FIG. 1I), while the first probe pad 62P, the second probe pad 64P, the third probe pad 66P and the fourth probe pad 68P are disposed at a second side (e.g., a front side) of the semiconductor substrate 12 (shown in FIG. 1I), and the first side is opposite to the second side. Furthermore, the first conductor 62C1 and the second conductor 64C1 are distributed at the first side (e.g., a back side) of the semiconductor substrate 12 (shown in FIG. 1I), while the third conductor 66C and the fourth conductor 68C are distributed at the second side (e.g., a front side) of the semiconductor substrate 12 (shown in FIG. 1I). The first probe pad 62P may be electrically connected to the first conductor 62C1 by a conductor 62C2 (e.g., a through semiconductor via) penetrating through the semiconductor substrate 12 (shown in FIG. 1I), and the second probe pad 64P may be electrically connected to the second conductor 64C1 through a conductor 64C2 (e.g., a through semiconductor via) penetrating through the semiconductor substrate 12 (shown in FIG. 1I). In some embodiments, the resistance of the first resistor 62R is greater than the resistance of the through semiconductor via 14. In some embodiments, the resistance of the first resistor 62R is about more than 10 times of the resistance of the through semiconductor via 14. For example, the resistance of the first resistor 62R ranges from about 10 times to about 10000 or more times of the resistance of the through semiconductor via 14. For example, the resistance of the through semiconductor via 14 is about 8 micro-Ohms (mΩ), and the resistance of the first resistor 62R is about more than 80 mΩ.

Referring to FIG. 2B, a test key 60B configured to measure the resistance of the through semiconductor via 14 embedded in the semiconductor substrate 12 (shown in FIG. 1I) is illustrated. The test key 60B includes a first resistor 62R, a first conductor 62C1 (e.g., a conductor wiring), a first probe pad 62P, a second conductor 64C1 (e.g., a conductor wiring), a second probe pad 64P, a third conductor 66C, a second resistor 66R, a third probe pad 66P, a fourth conductor 68C, and a fourth probe pad 68P. The first probe pad 62P is electrically connected to a first end (e.g., a bottom end) of the through semiconductor via 14 by the first resistor 62R and the first conductor 62C1. The second probe pad 64P is electrically connected to the first end (e.g., a bottom end) of the through semiconductor via 14 by the second conductor 64C1. The third probe pad 66P is electrically connected to a second end (e.g., a top end) of the through semiconductor via 14 by the second resistor 66R and the third conductor 66C. The fourth probe pad 68P is electrically connected to the second end (e.g., a top end) of the through semiconductor via 14 by the fourth conductor 68C. In some embodiments, the first resistor 62R is disposed at a first side (e.g., a back side) of the semiconductor substrate 12 (shown in FIG. 1I), while the first probe pad 62P, the second probe pad 64P, the second resistor 66R, the third probe pad 66P and the fourth probe pad 68P are disposed at a second side (e.g., a front side) of the semiconductor substrate 12 (shown in FIG. 1I), and the first side is opposite to the second side. Furthermore, the first conductor 62C1 and the second conductor 64C1 are distributed at the first side (e.g., a back side) of the semiconductor substrate 12 (shown in FIG. 1I), while the third conductor 66C, the second resistor 66R and the fourth conductor 68C are distributed at the second side (e.g., a front side) of the semiconductor substrate 12 (shown in FIG. 1I). The first probe pad 62P may be electrically connected to the first conductor 62C1 through a conductor 62C2 (e.g., a through semiconductor via) penetrating through the semiconductor substrate 12 (shown in FIG. 1I), and the second probe pad 64P may be electrically connected to the second conductor 64C1 through a conductor 64C2 (e.g., a through semiconductor via) penetrating through the semiconductor substrate 12 (shown in FIG. 1I). In some embodiments, the resistance of the first resistor 62R is greater than the resistance of the through semiconductor via 14. In some embodiments, the resistance of the first resistor 62R is about more than 10 times of the resistance of the through semiconductor via 14. For example, the resistance of the first resistor 62R ranges from about 10 times to about 10000 or more times of the resistance of the through semiconductor via 14. For example, the resistance of the through semiconductor via 14 is about 8 micro-Ohms (mΩ), and the resistance of the first resistor 62R is about more than 80 mΩ. In some embodiments, the resistance of the second resistor 66R is greater than the resistance of the through semiconductor via 14. In some embodiments, the resistance of the second resistor 66R is about more than 10 times of the resistance of the through semiconductor via 14. For example, the resistance of the second resistor 66R ranges from about 10 times to about 10000 or more times of the resistance of the through semiconductor via 14. For example, the resistance of the through semiconductor via 14 is about 8 micro-Ohms (mΩ), and the resistance of the second resistor 66R is about more than 80 mΩ. In some embodiments, the resistance of the first resistor 62R may substantially equal to the resistance of the second resistor 66R. In some other embodiments, the resistance of the first resistor 62R may different from the resistance of the second resistor 66R.

Referring to FIG. 2C, a test key 60C configured to measure the resistance of the through semiconductor via 14 embedded in the semiconductor substrate 12 (shown in FIG. 1I) is illustrated. The test key 60C includes a first conductor 62C1 (e.g., a conductor wiring), a first probe pad 62P, a second conductor 64C1 (e.g., a conductor wiring), a second probe pad 64P, a third conductor 66C1, a second resistor 66R, a third probe pad 66P, a fourth conductor 68C, and a fourth probe pad 68P. The first probe pad 62P is electrically connected to a first end (e.g., a bottom end) of the through semiconductor via 14 by the first conductor 62C1. The second probe pad 64P is electrically connected to the first end (e.g., a bottom end) of the through semiconductor via 14 by the second conductor 64C1. The third probe pad 66P is electrically connected to a second end (e.g., a top end) of the through semiconductor via 14 by the second resistor 66R and the third conductor 66C. The fourth probe pad 68P is electrically connected to the second end (e.g., a top end) of the through semiconductor via 14 by the fourth conductor 68C. In some embodiments, the first conductor 62C1 and the second conductor 64C1 are disposed at a first side (e.g., a back side) of the semiconductor substrate 12 (shown in FIG. 1I), while the first probe pad 62P, the second probe pad 64P, the second resistor 66R, the third probe pad 66P and the fourth probe pad 68P are disposed at a second side (e.g., a front side) of the semiconductor substrate 12 (shown in FIG. 1I), and the first side is opposite to the second side. Furthermore, the first conductor 62C1 and the second conductor 64C1 are distributed at the first side (e.g., a back side) of the semiconductor substrate 12 (shown in FIG. 1I), while the third conductor 66C, the second resistor 66R and the fourth conductor 68C are distributed at the second side (e.g., a front side) of the semiconductor substrate 12 (shown in FIG. 1I). The first probe pad 62P may be electrically connected to the first conductor 62C1 through a conductor 62C2 (e.g., a through semiconductor via) penetrating through the semiconductor substrate 12 (shown in FIG. 1I), and the second probe pad 64P may be electrically connected to the second conductor 64C1 through a conductor 64C2 (e.g., a through semiconductor via) penetrating through the semiconductor substrate 12 (shown in FIG. 1I). In some embodiments, the resistance of the through semiconductor via 14 can be roughly calculated based on the material (e.g., resistivity or sheet resistance) of the through semiconductor via 14 and the dimensions (width, height or cross-sectional area) of the through semiconductor via 14, and the resistance of the second resistor 66R is greater than the resistance of the through semiconductor via 14. In some embodiments, the resistance of the second resistor 66R is about more than 10 times of the resistance of the through semiconductor via 14. For example, the resistance of the second resistor 66R ranges from about 10 times to about 10000 or more times of the resistance of the through semiconductor via 14. For example, the resistance of the through semiconductor via 14 is about 8 micro-Ohms (mΩ), and the resistance of the second resistor 66R is about more than 80 mΩ.

When testing the test key 60A, 60B or 60C (e.g., Kelvin test), two probes of a probe card contact the first probe pad 62P and the third probe pad 66P to supply a test voltage to the first probe pad 62P. As shown in FIGS. 2A through 2C, a test current flows through the second probe pad 64P, the through semiconductor via 14, and the fourth probe pad 68P. The probe card measures the test current to calculate the equivalent resistance between the first probe pad 62P and the third probe pad 66P. And then, the probe card measures the resistance of the through semiconductor via 14 according to the equivalent resistance between the first probe pad 62P and the third probe pad 66P. Since the equivalent resistance between the first probe pad 62P and the third probe pad 66P is resulted from the through semiconductor via 14 as well as the resistor 62R and/or 66R, the measurement of the resistance of through semiconductor via 14 can be precise.

In some embodiments, the resistor 62R and/or the resistor 66R may be formed in interconnect structures of stacked semiconductor dies. In some other embodiments, the resistor 62R and/or the resistor 66R of the test keys 60A, 60B and 60C may be formed in an interconnect structure of a single semiconductor die. The arrangement of the 62R and/or the resistor 66R will be described in accompany with FIGS. 3 through 7.

FIGS. 3 through 7 schematically illustrate various cross-sectional views of SoIC structures in accordance with some other embodiments of the present disclosure.

Figure 3:
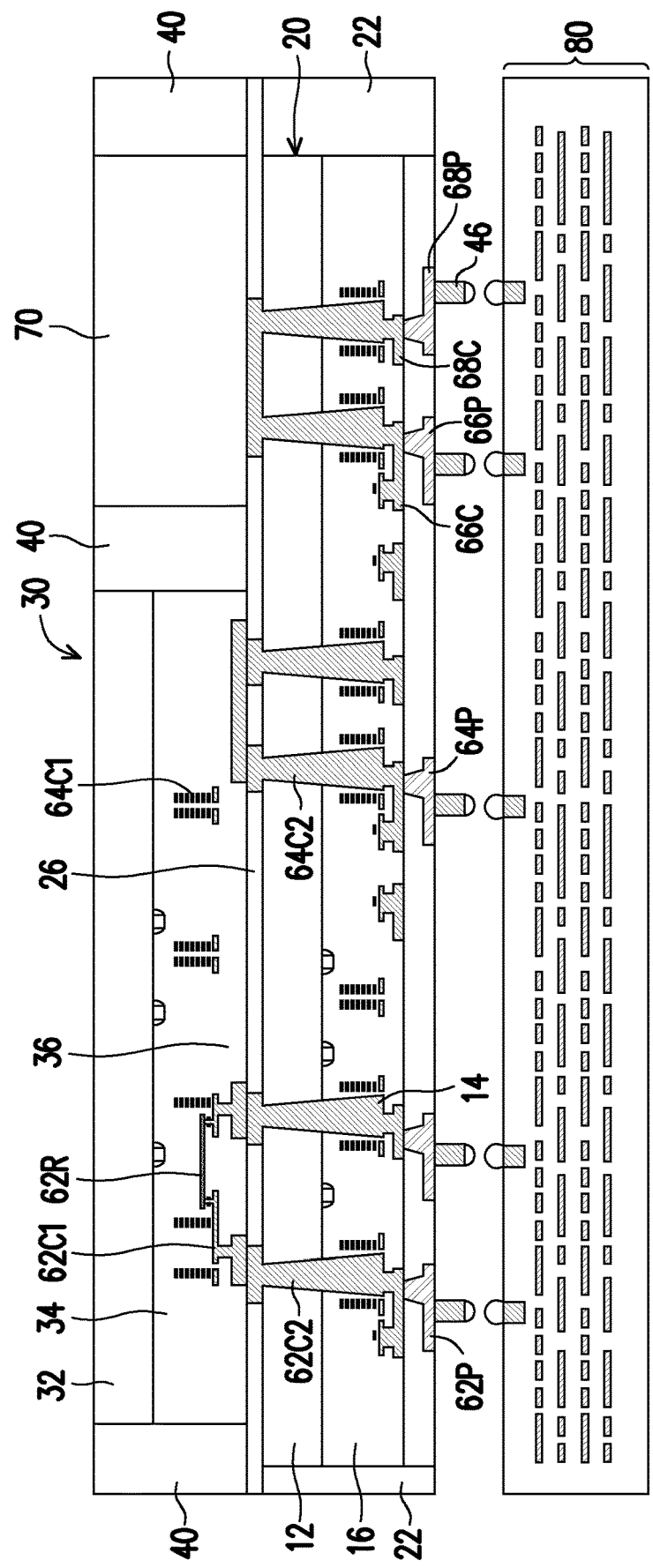
FIGS. 3 through 7 schematically illustrate various cross-sectional views of SoIC structures in accordance with some other embodiments of the present disclosure.

Referring to FIG. 2A and FIG. 3, the SoIC structure of the present embodiment includes a first semiconductor die 20 laterally encapsulated by an insulating encapsulant 22, a second semiconductor die 30 laterally encapsulated by an insulating encapsulant 40, and a test key 60A (shown in FIG. 2A) formed in the first semiconductor die 20 and the first semiconductor die 30. The first semiconductor die 20 includes a first semiconductor substrate 12, a first interconnect structure 16 disposed on the first semiconductor substrate 12, and a through semiconductor via 14 embedded in the first semiconductor substrate 12 and the first interconnect structure 16. The second semiconductor die 30 is disposed on and electrically connected to the first semiconductor die 20. The second semiconductor die 30 includes a second semiconductor substrate 32 and a second interconnect structure 34 disposed on the second semiconductor substrate 34. In the present embodiment, the test key 60A (shown in FIG. 2A) is distributed in the first interconnect structure 16 and the second interconnect structure 34. The first conductor 62C1, the first resistor 62R and the second conductor 64C1 of the test key 60A are distributed in the second interconnect structure 34, and the conductor 64C2 of the test key 60A is distributed in the first interconnect structure 16. The first probe pad 62P, the second probe pad 64P, the third probe pad 66P and the fourth probe pad 68P of the test key 60A are disposed over and electrically connected to the first interconnect structure 16.

The first probe pad 62P is electrically connected to a first end of the through semiconductor via 14 by the conductor 64C2, the second conductor 64C1 as well as the first resistor 62R. The conductor 64C2 is in the first interconnect structure 16, and the second conductor 64C1 is in the second interconnect structure 34. The second probe pad 64P is electrically connected to the first end of the through semiconductor via 14 by at least the second conductor 64C2. The third conductor 66C is in the first interconnect structure 16. The third probe pad 66P is electrically connected to a second end of the through semiconductor via 14 by at least the third conductor 66C. The fourth conductor 68C is in the first interconnect structure 16. The fourth probe pad 68P is electrically connected to the second end of the through semiconductor via 14 by at least the fourth conductor 68C.

As illustrated in FIG. 3, the SoIC structure may further include a dummy die 70 laterally encapsulated by the insulating encapsulant 40. Furthermore, Kelvin test may be performed to measure the resistance of the SoIC structure, and the Kelvin test may be performed by a probe card 80.

Figure 4:
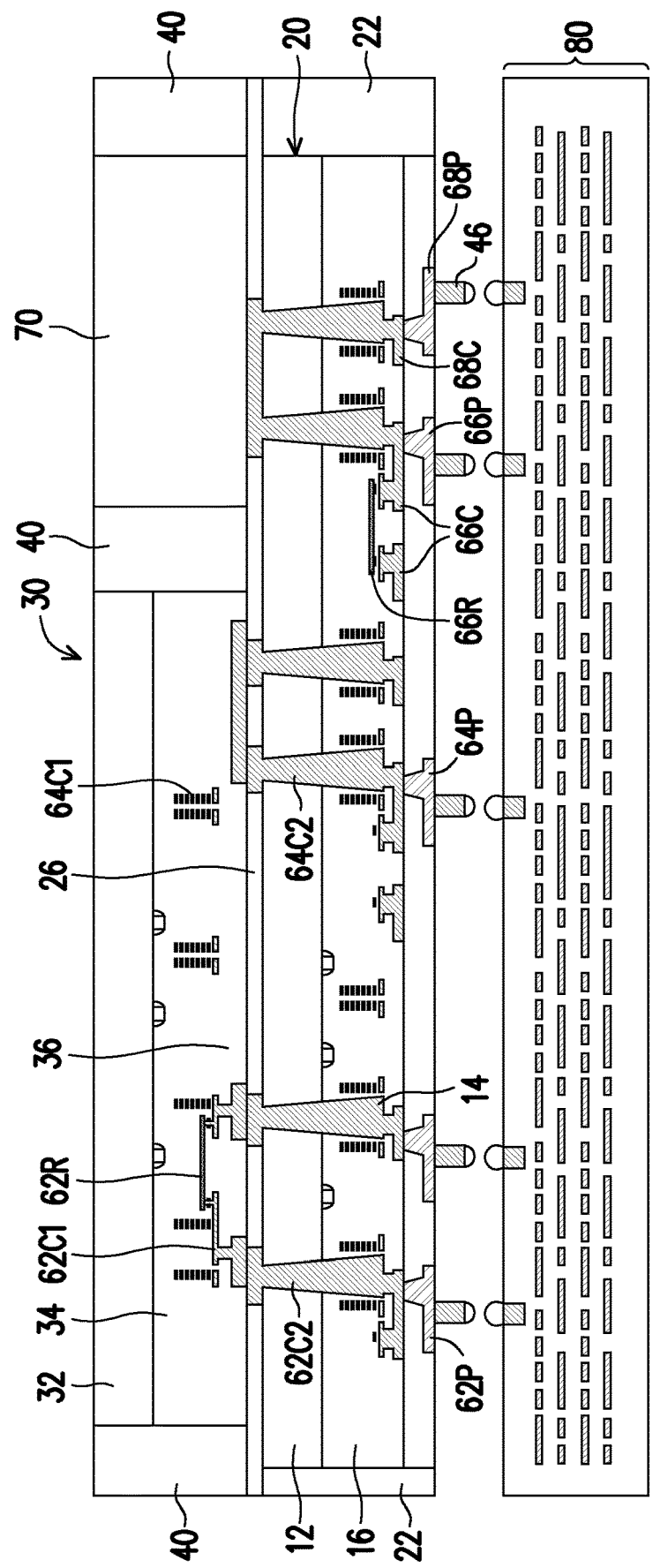

Referring FIG. 2B and FIG. 4, the SoIC structure of the present embodiment includes a first semiconductor die 20 laterally encapsulated by an insulating encapsulant 22, a second semiconductor die 30 laterally encapsulated by an insulating encapsulant 40, and a test key 60B (shown in FIG. 2B) formed in the first semiconductor die 20 and the first semiconductor die 30. The first semiconductor die 20 includes a first semiconductor substrate 12, a first interconnect structure 16 disposed on the first semiconductor substrate 12, and a through semiconductor via 14 embedded in the first semiconductor substrate 12 and the first interconnect structure 16. The second semiconductor die 30 is disposed on and electrically connected to the first semiconductor die 20. The second semiconductor die 30 includes a second semiconductor substrate 32 and a second interconnect structure 34 disposed on the second semiconductor substrate 34. In the present embodiment, the test key 60B (shown in FIG. 2B) is distributed in the first interconnect structure 16 and the second interconnect structure 34. The first conductor 62C1, the first resistor 62R and the second conductor 64C1 of the test key 60B are distributed in the second interconnect structure 34, and the conductor 64C2 and the second resistor 66R of the test key 60B are distributed in the first interconnect structure 16. The first probe pad 62P, the second probe pad 64P, the third probe pad 66P and the fourth probe pad 68P of the test key 60A are disposed over and electrically connected to the first interconnect structure 16.

The first probe pad 62P is electrically connected to a first end of the through semiconductor via 14 by the conductor 64C2, the second conductor 64C1 as well as the first resistor 62R. The conductor 64C2 is in the first interconnect structure 16, and the second conductor 64C1 is in the second interconnect structure 34. The second probe pad 64P is electrically connected to the first end of the through semiconductor via 14 by at least the second conductor 64C2. The third conductor 66C is in the first interconnect structure 16. The third probe pad 66P is electrically connected to a second end of the through semiconductor via 14 by the second resistor 66R and the third conductor 66C. The fourth conductor 68C is in the first interconnect structure 16. The fourth probe pad 68P is electrically connected to the second end of the through semiconductor via 14 by at least the fourth conductor 68C.

Figure 5:
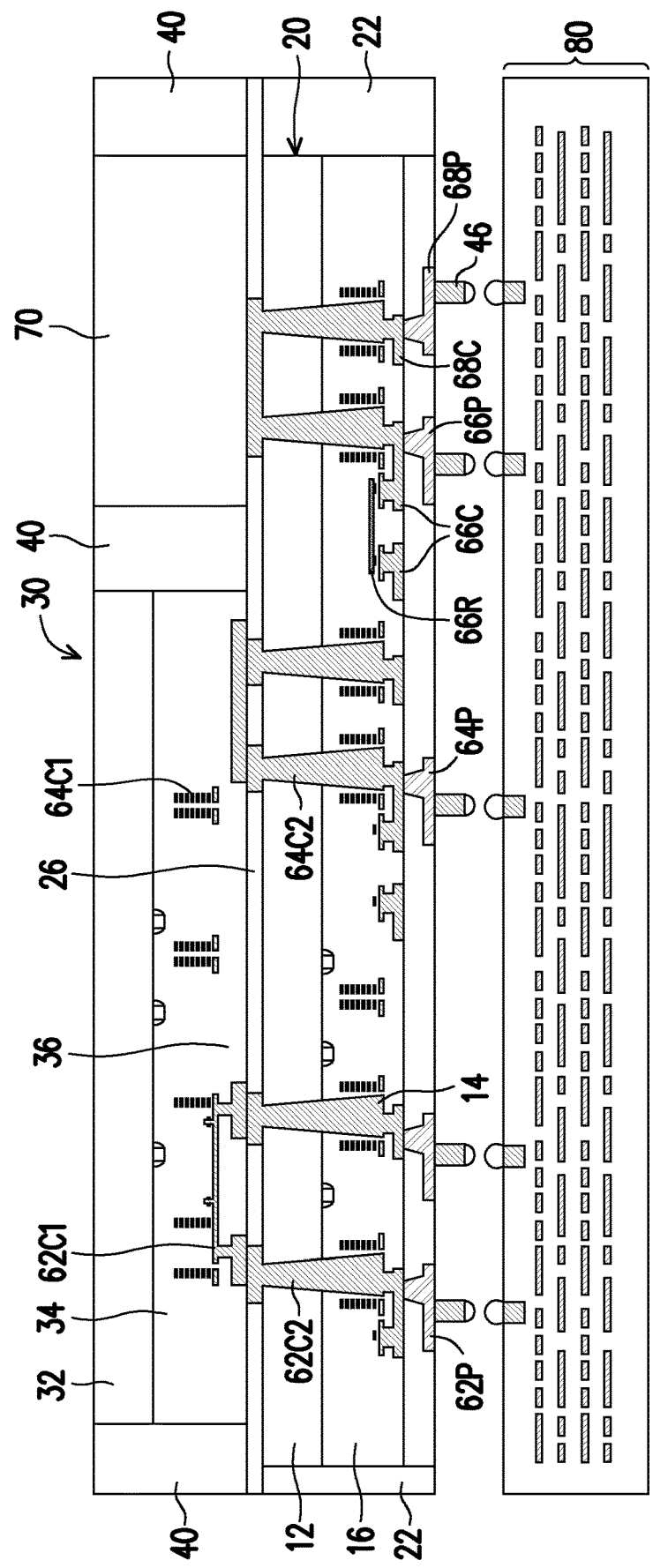

Referring to FIG. 2C and FIG. 5, the SoIC structure of the present embodiment includes a first semiconductor die 20 laterally encapsulated by an insulating encapsulant 22, a second semiconductor die 30 laterally encapsulated by an insulating encapsulant 40, and a test key 60C (shown in FIG. 2C) formed in the first semiconductor die 20 and the first semiconductor die 30. The first semiconductor die 20 includes a first semiconductor substrate 12, a first interconnect structure 16 disposed on the first semiconductor substrate 12, and a through semiconductor via 14 embedded in the first semiconductor substrate 12 and the first interconnect structure 16. The second semiconductor die 30 is disposed on and electrically connected to the first semiconductor die 20. The second semiconductor die 30 includes a second semiconductor substrate 32 and a second interconnect structure 34 disposed on the second semiconductor substrate 34. In the present embodiment, the test key 60C (shown in FIG. 2C) is distributed in the first interconnect structure 16 and the second interconnect structure 34. The first conductor 62C1 and the second conductor 64C1 of the test key 60B are distributed in the second interconnect structure 34, and the conductor 64C2 and the second resistor 66R of the test key 60B are distributed in the first interconnect structure 16. The first probe pad 62P, the second probe pad 64P, the third probe pad 66P and the fourth probe pad 68P of the test key 60A are disposed over and electrically connected to the first interconnect structure 16.

The first probe pad 62P is electrically connected to a first end of the through semiconductor via 14 by the conductor 64C2 and the second conductor 64C1. The conductor 64C2 is in the first interconnect structure 16, and the second conductor 64C1 is in the second interconnect structure 34. The second probe pad 64P is electrically connected to the first end of the through semiconductor via 14 by at least the second conductor 64C2. The third conductor 66C is in the first interconnect structure 16. The third probe pad 66P is electrically connected to a second end of the through semiconductor via 14 by the second resistor 66R and the third conductor 66C. The fourth conductor 68C is in the first interconnect structure 16. The fourth probe pad 68P is electrically connected to the second end of the through semiconductor via 14 by at least the fourth conductor 68C.

Figure 6:
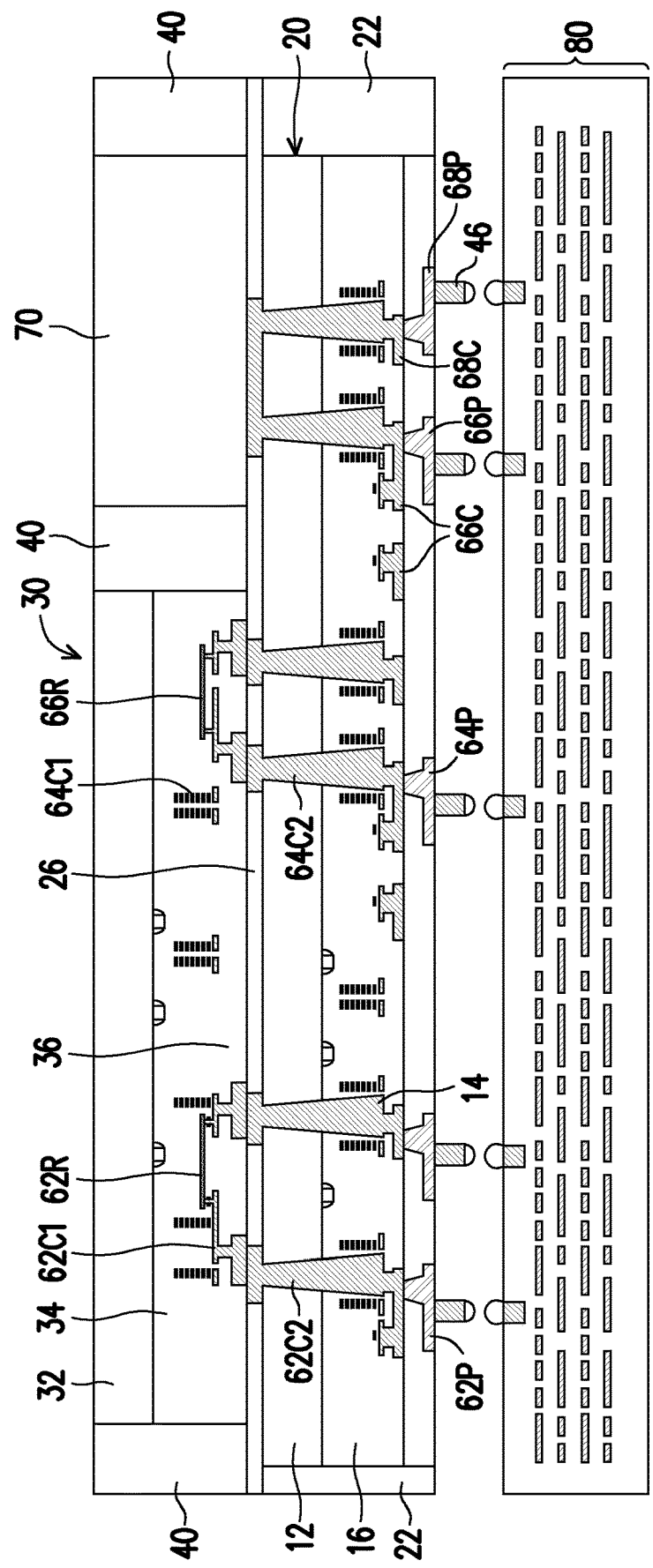

Referring to FIG. 4 and FIG. 6, the SoIC structure illustrated in FIG. 6 is similar with the SoIC structure illustrated in FIG. 4 except that both the first resistor 62R and the second resistor 66R are distributed in the second interconnect structure 34.

Figure 7:
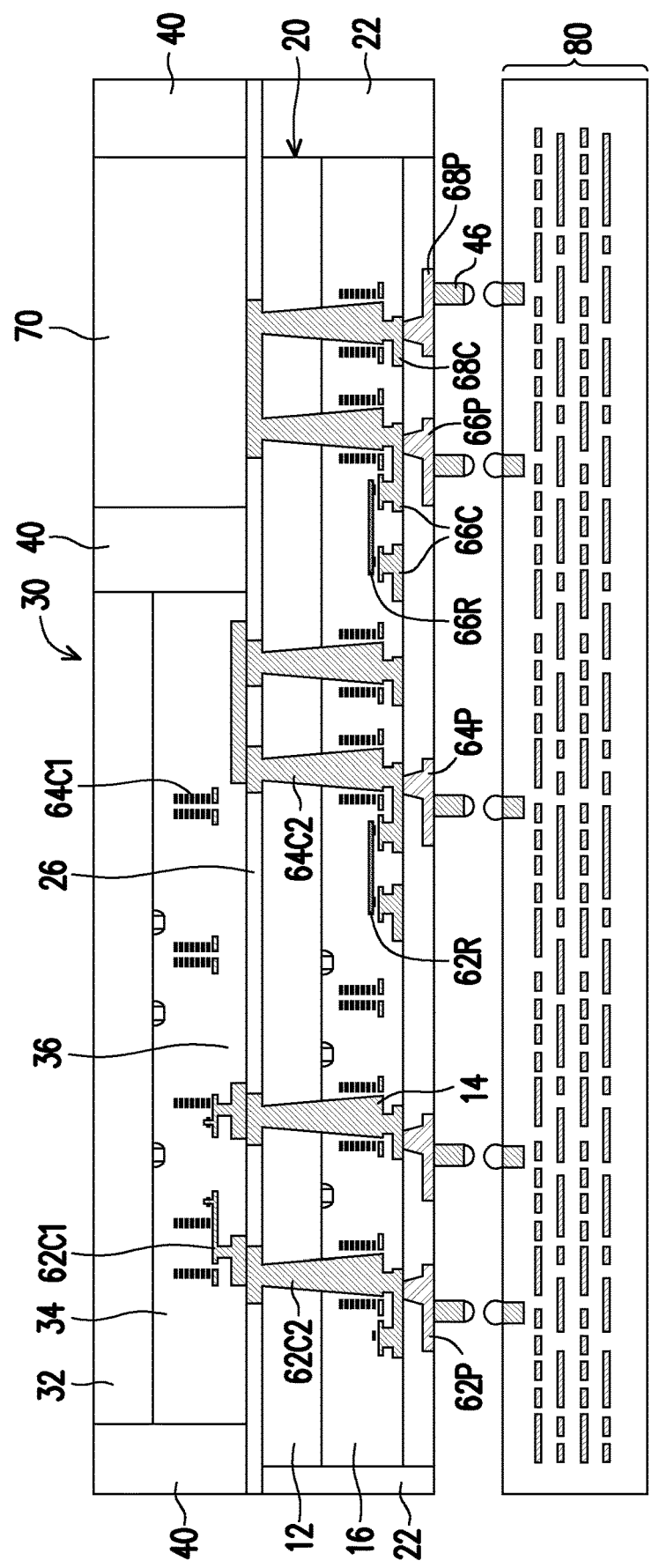

In accordance with some other embodiments of the disclosure,

Referring to FIG. 4 and FIG. 7, the SoIC structure illustrated in FIG. 7 is similar with the SoIC structure illustrated in FIG. 4 except that both the first resistor 62R and the second resistor 66R are distributed in the first interconnect structure 16. In other words, the through semiconductor via 14 to be measured, the first resistor 62R and the second resistor 66R are distributed in the semiconductor die 20.

Although the test keys illustrated in the above-mentioned embodiments are formed in SoIC structures, the test keys may be applied in Integrated Fan-Out (InFO) packages, Chip-on-Wafer-on Substrate (CoWoS) packages or other types of packages.

In the above-mentioned embodiments, at least one resistor (e.g., resistor 62R and/or 66R) with large resistance is implemented in measurement of resistance of the through semiconductor via, and the voltage drop resulted from the through semiconductor via as well as the at least one resistor. Accordingly, the at least one resistor facilitates the measurement of the resistance of the through semiconductor via, and the measurement of the resistance of through semiconductor via 14 can be precise.

FIG. 8A through 8D schematically illustrate various cross-sectional views of a resistor in the test key in accordance with some embodiments of the present disclosure. FIG. 9A through 9C schematically illustrate various top views of a resistor in the test key in accordance with some embodiments of the present disclosure.

Figure 8A:
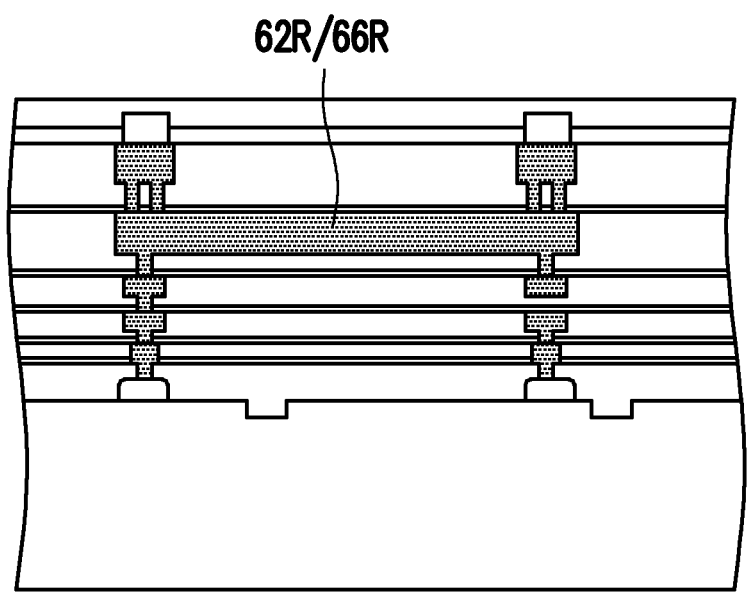
FIG. 8A through 8D schematically illustrate various cross-sectional views of a resistor in the test key in accordance with some embodiments of the present disclosure.
Figure 9A:
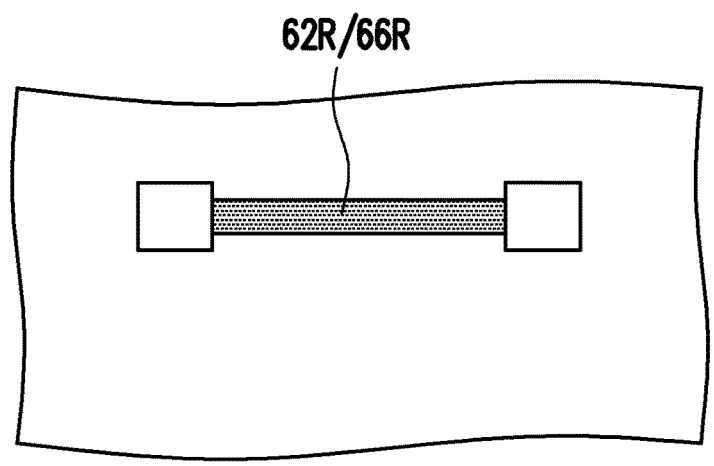
FIG. 9A through 9C schematically illustrate various top views of a resistor in the test key in accordance with some embodiments of the present disclosure.
Figure 9B:
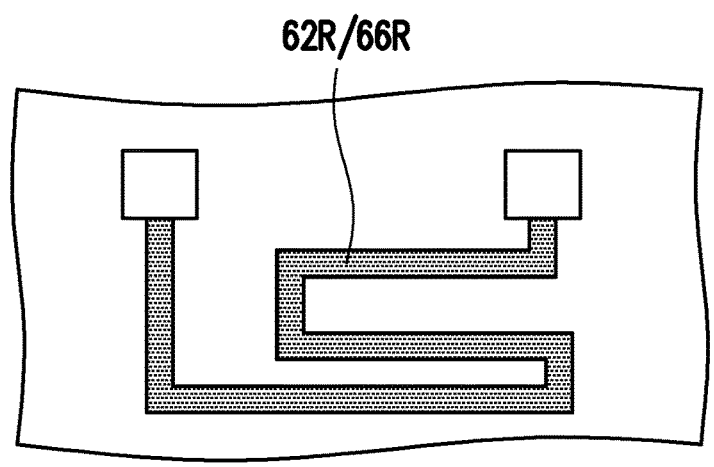
Figure 9C:
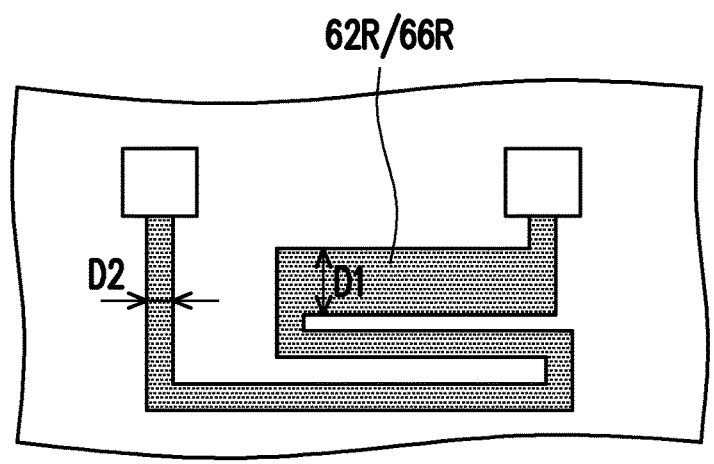

As illustrated in FIG. 8A, the resistor 62R and/or 66R distributed in the semiconductor die 20 and/or the semiconductor die 30 may include a single layered resistor pattern, wherein the resistor 62R and/or 66R may be a straight-line pattern having a constant width as shown in FIG. 9A, a meandering pattern having a constant width as shown FIG. 9B or a meandering pattern having various widths D1 and D2 as shown in FIG. 9C.

Figure 8B:
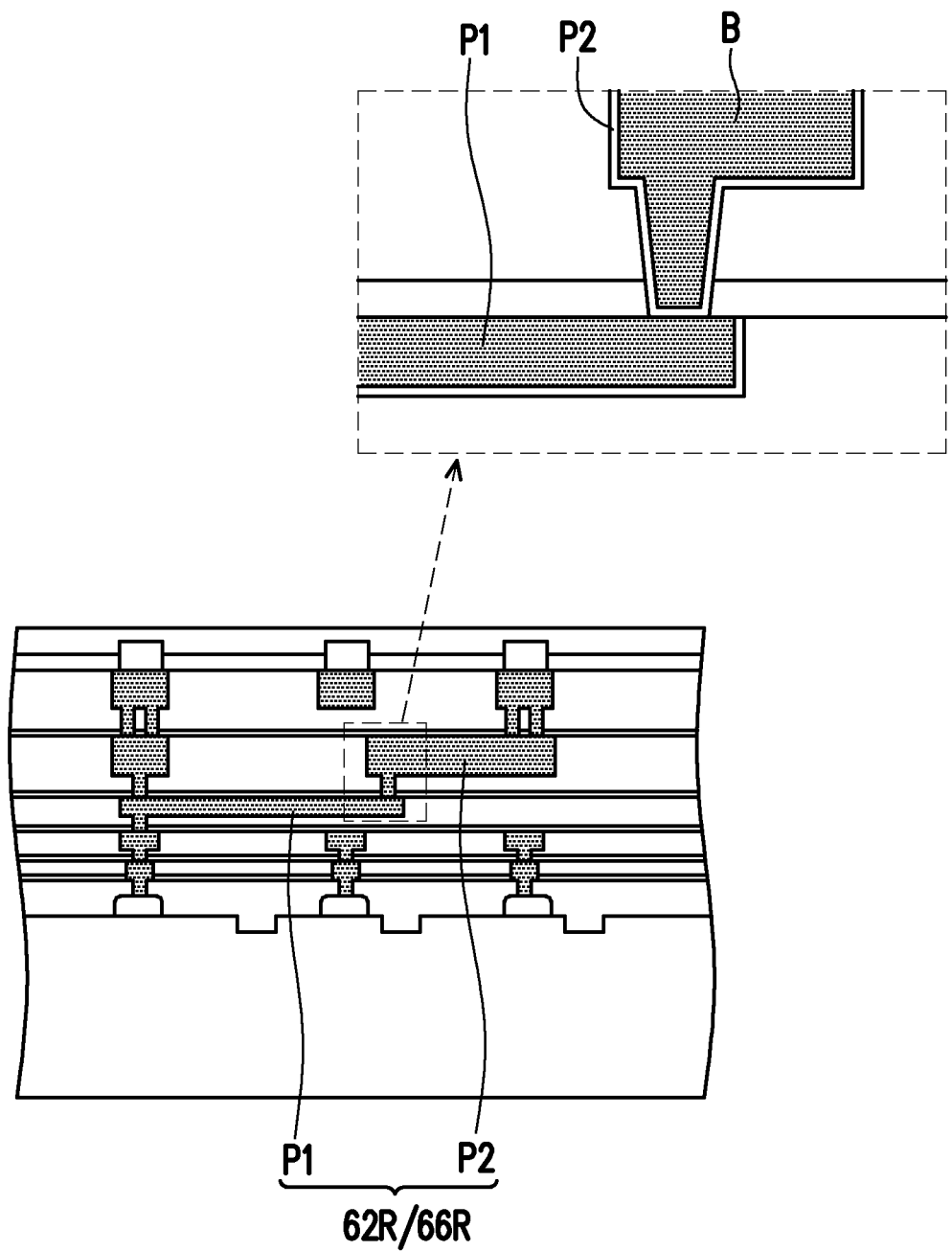

In some other embodiments, as illustrated in FIG. 8B, the resistor 62R and/or 66R distributed in the semiconductor die 20 and/or the semiconductor die 30 may include a multi-layered resistor pattern, the multi-layered resistor pattern may include a first resistor pattern P1 (e.g., a lower resistor pattern) and a second resistor pattern P2 (e.g., an upper resistor pattern), wherein each the first resistor pattern P1 and the second resistor pattern P2 may be a straight-line pattern having a constant width as shown in FIG. 9A, a meandering pattern having a constant width as shown FIG. 9B or a meandering pattern having various widths D1 and D2 as shown in FIG. 9C. As illustrated in FIG. 8B, each of the first resistor pattern P1 and the second resistor pattern P2 may include barrier layer B, and the material of the barrier may include Ta, TaN, Ti and/or TiN.

Figure 8C:
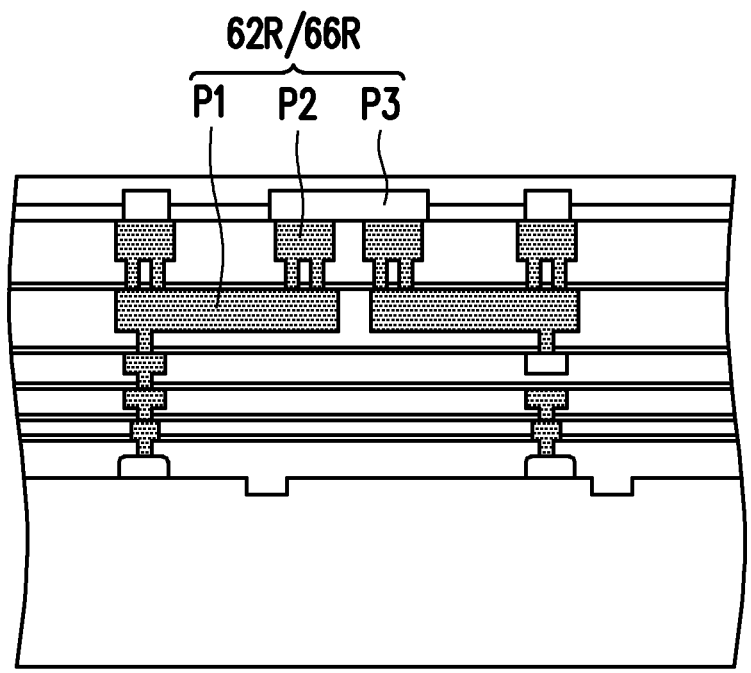

In another embodiments, as illustrated in FIG. 8C, the resistor 62R and/or 66R distributed in the semiconductor die 20 and/or the semiconductor die 30 may include a multi-layered resistor pattern, the multi-layered resistor pattern may include a first resistor pattern P1 (e.g., a lower resistor pattern), a second resistor pattern P2 (e.g., a middle resistor pattern) and a third resistor pattern P3 (e.g., an upper resistor pattern), wherein the first resistor pattern P1 and the second resistor pattern P2 are formed in the interconnect structure, and the third resistor pattern P3 are aluminum pads or aluminum patterns formed over the interconnect structure.

Figure 8D:
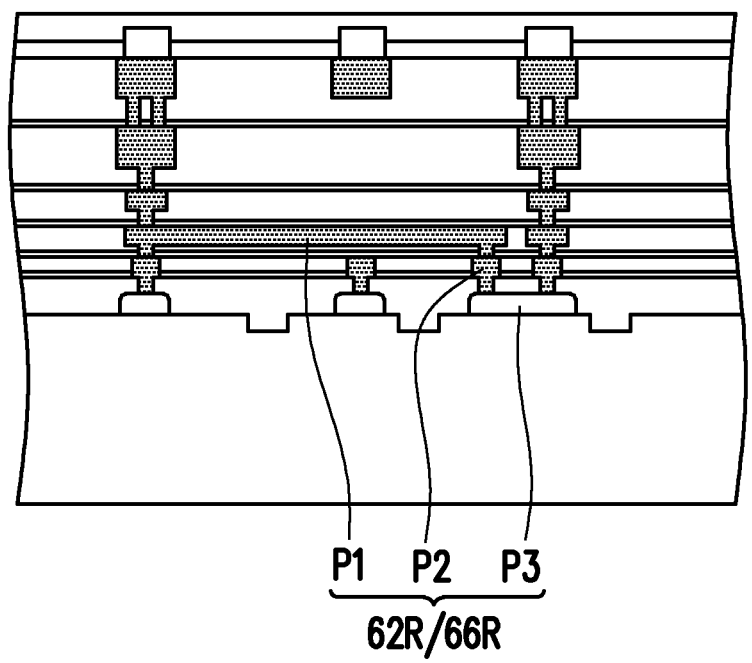

In some alternative embodiments, as illustrated in FIG. 8D, the resistor 62R and/or 66R distributed in the semiconductor die 20 and/or the semiconductor die 30 may include a multi-layered resistor pattern, the multi-layered resistor pattern may include a first resistor pattern P1 (e.g., an upper resistor pattern), a second resistor pattern P2 (e.g., a middle resistor pattern) and a third resistor pattern P3 (e.g., a lower resistor pattern), wherein the first resistor pattern P1 may include copper formed in the interconnect structure through BEOL processes, the second resistor pattern P1 may include tungsten formed under the interconnect structure through (front end of line, MEOL) processes, and the third resistor pattern P3 may include polysilicon formed under the interconnect structure through FEOL processes.

In accordance with some embodiments of the disclosure, a test key configured to measure resistance of a through semiconductor via in a semiconductor substrate is provided. The test key includes a first resistor, a first conductor, a first probe pad, a second conductor, a second probe pad, a third conductor, a third probe pad, a fourth conductor, and a fourth probe pad. The first probe pad is electrically connected to a first end of the through semiconductor via by the first resistor and the first conductor. The second probe pad is electrically connected to the first end of the through semiconductor via by the second conductor. The third probe pad is electrically connected to a second end of the through semiconductor via by the third conductor. The fourth probe pad is electrically connected to the second end of the through semiconductor via by the fourth conductor. In some embodiments, the first resistor is disposed at a first side of the semiconductor substrate, the first probe pad, the second probe pad, the third probe pad and the fourth probe pad are disposed at a second side of the semiconductor substrate, and the first side is opposite to the second side. In some embodiments, a resistance of the first resistor is greater than the resistance of the through semiconductor via. In some embodiments, a resistance of the first resistor is about more than 10 times of a resistance of the through semiconductor via. In some embodiments, the test key further includes a second resistor, wherein the third probe pad is electrically connected to the second end of the through semiconductor via by the second resistor and the third conductor. In some embodiments, the first resistor is disposed at a first side of the semiconductor substrate, the second resistor, the first probe pad, the second probe pad, the second resistor, the third probe pad and the fourth probe pad are disposed at a second side of the semiconductor substrate, and the first side is opposite to the second side. In some embodiments, the resistance of the second resistor is greater than the resistance of the through semiconductor via. In some embodiments, a resistance of the second resistor is about more than 10 times of a resistance of the through semiconductor via.

In accordance with some other embodiments of the disclosure, a first semiconductor die, a second semiconductor die and a test key is provided. The first semiconductor die includes a first semiconductor substrate, a first interconnect structure disposed on the first semiconductor substrate, and a through semiconductor via embedded in the first semiconductor substrate. The second semiconductor die is disposed on and electrically connected to the first semiconductor die. The second semiconductor die includes a second semiconductor substrate and a second interconnect structure disposed on the second semiconductor substrate. The test key is in the first interconnect structure and the second interconnect structure. The test key includes a first resistor, a first conductor, a first probe pad, a second conductor, a second probe pad, a third conductor, a third probe pad, a fourth conductor and a fourth probe pad. The first resistor is in the first interconnect structure or the second interconnect structure. The first conductor is in the first interconnect structure and the second interconnect structure. The first probe pad is over the first interconnect structure, and the first probe pad is electrically connected to a first end of the through semiconductor via by the first resistor and the first conductor. The second conductor is in the first interconnect structure and the second interconnect structure. The second probe pad is over the first interconnect structure, and the second probe pad is electrically connected to the first end of the through semiconductor via by the second conductor. The third conductor is in the first interconnect structure. The third probe pad is over the first interconnect structure, and the third probe pad is electrically connected to a second end of the through semiconductor via by the third conductor. The fourth conductor is in the first interconnect structure. The fourth probe pad is over the first interconnect structure, and the fourth probe pad is electrically connected to the second end of the through semiconductor via by the fourth conductor. In some embodiments, a resistance of the first resistor is greater than a resistance of the through semiconductor via. In some embodiments, a resistance of the first resistor is about more than 10 times of a resistance of the through semiconductor via. In some embodiments, the structure further includes a second resistor in the first interconnect structure, wherein the third probe pad is electrically connected to the second end of the through semiconductor via by the second resistor and the third conductor. In some embodiments, a resistance of the second resistor is greater than a resistance of the through semiconductor via. In some embodiments, a resistance of the second resistor is about more than 10 times of a resistance of the through semiconductor via.

In accordance with some other embodiments of the disclosure, a semiconductor die, including a semiconductor substrate, an interconnect structure, a through semiconductor via and a test key is provided. The interconnect structure is disposed on the semiconductor substrate. The through semiconductor via is embedded in the semiconductor substrate and the interconnect structure. The test key is disposed in the interconnect structure. The test key includes a first resistor, a first conductor, a first probe pad, a second conductor, a second probe pad, a third conductor, a third probe pad, a fourth conductor, and a fourth probe pad. The first probe pad is electrically connected to a first end of the through semiconductor via by the first resistor and the first conductor. The second probe pad is electrically connected to the first end of the through semiconductor via by the second conductor. The third probe pad is electrically connected to a second end of the through semiconductor via by the third conductor. The fourth probe pad is electrically connected to the second end of the through semiconductor via by the fourth conductor. In some embodiments, a resistance of the first resistor is greater than a resistance of the through semiconductor via. In some embodiments, a resistance of the first resistor is about more than 10 times of a resistance of the through semiconductor via. In some embodiments, the semiconductor die further includes a second resistor in the first interconnect structure, wherein the third probe pad is electrically connected to the second end of the through semiconductor via by the second resistor and the third conductor. In some embodiments, a resistance of the second resistor is greater than a resistance of the through semiconductor via. In some embodiments, a resistance of the second resistor is about more than 10 times of a resistance of the through semiconductor via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A test key configured to measure resistance of a through semiconductor via in a semiconductor substrate, the test key comprising:
   a first resistor;
   a first conductor;
   a first probe pad electrically connected to a first end of the through semiconductor via by the first resistor and the first conductor;
   a second conductor;
   a second probe pad electrically connected to the first end of the through semiconductor via by the second conductor;
   a third conductor;
   a third probe pad electrically connected to a second end of the through semiconductor via by the third conductor;
   a fourth conductor; and
   a fourth probe pad electrically connected to the second end of the through semiconductor via by the fourth conductor.

2. The test key of claim 1, wherein
   the first resistor is disposed at a first side of the semiconductor substrate,
   the first probe pad, the second probe pad, the third probe pad and the fourth probe pad are disposed at a second side of the semiconductor substrate, and
   the first side is opposite to the second side.

3. The test key of claim 1, wherein a resistance of the first resistor greater than a resistance of the through semiconductor via.

4. The test key of claim 1, wherein a resistance of the first resistor is about more than 10 times of a resistance of the through semiconductor via.

5. The test key of claim 1 further comprising:
   a second resistor, wherein the third probe pad is electrically connected to the second end of the through semiconductor via by the second resistor and the third conductor.

6. The test key of claim 5, wherein
   the first resistor is disposed at a first side of the semiconductor substrate,
   the second resistor, the first probe pad, the second probe pad, the second resistor, the third probe pad and the fourth probe pad are disposed at a second side of the semiconductor substrate, and
   the first side is opposite to the second side.

7. The test key of claim 5, wherein a resistance of the second resistor is greater than a resistance of the through semiconductor via.

8. The test key of claim 5, wherein a resistance of the second resistor is about more than 10 times of a resistance of the through semiconductor via.

9. A structure, comprising:
- a first semiconductor die comprising a first semiconductor substrate, a first interconnect structure disposed on the first semiconductor substrate, and a through semiconductor via embedded in the first semiconductor substrate;
- a second semiconductor die disposed on and electrically connected to the first semiconductor die, the second semiconductor die comprising a second semiconductor substrate and a second interconnect structure disposed on the second semiconductor substrate;
- a test key in the first interconnect structure and the second interconnect structure, the test key comprising:
  - a first resistor in the first interconnect structure or the second interconnect structure;
  - a first conductor in the first interconnect structure and the second interconnect structure;
  - a first probe pad over the first interconnect structure, and the first probe pad being electrically connected to a first end of the through semiconductor via by the first resistor and the first conductor;
  - a second conductor in the first interconnect structure and the second interconnect structure;
  - a second probe pad over the first interconnect structure, and the second probe pad being electrically connected to the first end of the through semiconductor via by the second conductor;
  - a third conductor in the first interconnect structure;
  - a third probe pad over the first interconnect structure, and the third probe pad being electrically connected to a second end of the through semiconductor via by the third conductor;
  - a fourth conductor in the first interconnect structure; and
  - a fourth probe pad over the first interconnect structure, and the fourth probe pad being electrically connected to the second end of the through semiconductor via by the fourth conductor.

10. The structure of claim 9, wherein a resistance of the first resistor is greater than a resistance of the through semiconductor via.

11. The structure of claim 9, wherein a resistance of the first resistor is about more than 10 times of a resistance of the through semiconductor via.

12. The structure of claim 9 further comprising:
- a second resistor in the first interconnect structure, wherein the third probe pad is electrically connected to the second end of the through semiconductor via by the second resistor and the third conductor.

13. The structure of claim 12, wherein a resistance of the second resistor is greater than a resistance of the through semiconductor via.

14. The structure of claim 12, wherein a resistance of the second resistor is about more than 10 times of a resistance of the through semiconductor via.

15. A semiconductor die, comprising:
- a semiconductor substrate;
- an interconnect structure disposed on the semiconductor substrate;
- a through semiconductor via embedded in the semiconductor substrate;
- a test key disposed in the interconnect structure, the test key comprising:
  - a first resistor;
  - a first conductor;
  - a first probe pad, wherein the first probe pad is electrically connected to a first end of the through semiconductor via by the first resistor and the first conductor;
  - a second conductor;
  - a second probe pad, wherein the second probe pad is electrically connected to the first end of the through semiconductor via by the second conductor;
  - a third conductor;
  - a third probe pad, wherein the third probe pad is electrically connected to a second end of the through semiconductor via by the third conductor;
  - a fourth conductor; and
  - a fourth probe pad, wherein the fourth probe pad is electrically connected to the second end of the through semiconductor via by the fourth conductor.

16. The semiconductor die of claim 15, wherein a resistance of the first resistor is greater than a resistance of the through semiconductor via.

17. The semiconductor die of claim 15, wherein a resistance of the first resistor is about more than 10 times of a resistance of the through semiconductor via.

18. The semiconductor die of claim 15 further comprising:
- a second resistor in the interconnect structure, wherein the third probe pad is electrically connected to the second end of the through semiconductor via by the second resistor and the third conductor.

19. The semiconductor die of claim 18, wherein a resistance of the second resistor is greater than a resistance of the through semiconductor via.

20. The semiconductor die of claim 18, wherein a resistance of the second resistor is about more than 10 times of a resistance of the through semiconductor via.

* * * * *